(12) United States Patent
Ono et al.

(10) Patent No.: US 6,954,380 B2
(45) Date of Patent: Oct. 11, 2005

(54) PROGRAMMING METHOD OF NONVOLATILE SEMICONDUCTOR MEMORY DEVICE

(75) Inventors: Tsuyoshi Ono, Tenri (JP); Masahiko Watanabe, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/913,251

(22) Filed: Aug. 6, 2004

(65) Prior Publication Data

US 2005/0024938 A1 Feb. 3, 2005

(30) Foreign Application Priority Data

Aug. 8, 2003 (JP) ....................................... 2003-289838

(51) Int. Cl.[7] .............................................. G11C 16/04
(52) U.S. Cl. .............................. 365/185.24; 365/185.22
(58) Field of Search ....................... 365/185.24, 185.22, 365/185.26, 185.03

(56) References Cited

U.S. PATENT DOCUMENTS

| | | | | | |
|---|---|---|---|---|---|
| 5,568,419 | A | * | 10/1996 | Atsumi et al. | ........... 356/185.3 |
| 5,943,263 | A | * | 8/1999 | Roohparvar | ........... 365/185.18 |
| 6,339,547 | B1 | * | 1/2002 | Roohparvar | ........... 365/185.18 |
| 6,850,438 | B2 | * | 2/2005 | Lee et al. | ............... 365/185.11 |

OTHER PUBLICATIONS

Campardo, G. et al. (Nov. 2000). "40–mm² 3–V–Only 50–MHz 64–Mb 2–b/cell CHE NOR Flash Memory," *IEEE Journal of Solid–State Circuits* 35(11):1655–1667.

Jung, T–S. et al. (Nov. 1996). "A 117–mm² 3.3–V Only 128–Mb Multilevel NAND Flash Memory for Mass Storage Applications," *IEEE Journal of Solid–State Circuits* 31(11):1575–1583.

Takeuchi, K. et al. (Apr. 1996). "A Double–Level–$V_{th}$ Select Gate Array Architecture for Multilevel NAND Flash Memories," *IEEE Journal of Solid–State Circuits* 31(4):602–609.

* cited by examiner

Primary Examiner—Son T. Dinh
Assistant Examiner—Hien Nguyen
(74) *Attorney, Agent, or Firm*—Morrison & Foerster LLP

(57) ABSTRACT

This invention provides a programming method of a nonvolatile semiconductor device capable of programming multi-value data of three or more values rapidly. If between two threshold voltage ranges corresponding to respective memory states before and after programming, at least one threshold voltage range corresponding to other memory states exists in a programming target memory cell, a first programming step of applying at least one first program gate voltage corresponding to at least one of other memory states and a predetermined program drain voltage to a programming target memory cell is executed, then a second programming step of applying a second program gate voltage corresponding to a programmed state after programming and a predetermined program drain voltage is executed, and thereafter a verification step of verifying whether or not a program is made in a programming target memory cell is executed.

16 Claims, 19 Drawing Sheets

| | Initial | After | time delay($\mu$ sec) |
|---|---|---|---|
| time delay from 0 V to VgM[n].V<br>t_0-Vgp | GND | VgM[n] | 2 |
| time delay from VgM[n] V to 0 V<br>t_Vgp-0 | GND | Vgv | 0.3 |
| time delay from 0 V to Vgv V<br>t_0-Vgv | VgM[n] | GND | 0.8 |
| time delay from Vgv V to 0 V<br>t_Vgv-0 | Vgv | GND | 1 |
| time delay from VgM[n] V to Vg(M+1)[n] V<br>t_Vgp-Vgp | VgM[n] | Vg(M+1)[n] | 1 |
| pulse application time<br>Wp10,Wp01,Wp00 | VgM[n] | VgM[n] | 4 |
| verification time<br>Wv | Vgv | Vgv | 0.5 |
| time of one program cycle for programming 3-level data (conventional) | | | 25.8 |
| time of one program cycle for programming 3-level data (inventive) | | | 18.6 |
| ratio of programming time between conventional and inventive method | | | 72% |

FIG.19

PROGRAMMING METHOD OF NONVOLATILE SEMICONDUCTOR MEMORY DEVICE

BACKGROUND OF THE INVENTION

1. Field of the Invention

The present invention relates to a nonvolatile semiconductor memory device including a memory cell array constituted by arranging plural memory cells in the directions of rows and columns, the memory cells each having a charge accumulation region formed between a channel region and a control gate via insulation films and a programming method of the memory cell array. More particularly, the present invention relates to a nonvolatile semiconductor memory device whose memory cell is capable of storing data of three or more values.

2. Description of the Related Art

Conventionally as the most general flash memory of this kind of the nonvolatile semiconductor memory device, for example, EPROM thin oxide (ETOX, registered trade mark of Intel Corp.) type flash memory has been available.

FIGS. 12A and 12B are a schematic sectional view of a memory cell transistor constituting a memory cell of an ETOX type flash memory and its equivalent circuit. As shown in FIGS. 12A and 12B, a floating gate 40, which acts as a charge accumulation region, is formed on a channel region 41 between a source 45 and a drain 46 via a tunnel oxide film 43 and further, a control gate 42 is formed via an interlayer insulation film 44.

The operation principle of this ETOX type flash memory cell will be described. When programming in the memory cell, a voltage Vpp (e.g., 9 V) is applied to the control gate, while a reference voltage Vss (e.g., 0 V) is applied to the source and a voltage Vdp (e.g., 5 V) is applied to the drain. Consequently, a large current flows through the channel region between the source and drain, so that hot electrons are generated in a portion having a high electric field in the vicinity of the drain and the electrons are injected into the floating gate, thereby the threshold voltage being raised. That is, it comes that a great number of electrons are injected into the floating gate as shown in FIG. 13B.

When erasing a programmed memory cell, voltages Vnn (e.g., −9 V) and Vpe (e.g., 6 V) are applied to the control gate and the source, respectively, and then, the threshold voltage is lowered by pulling out electrons in the vicinity of the source. That is, the number of electrons is smaller as shown in FIG. 13A as compared to the programmed state.

An actual flash memory is not of a single memory cell, but as shown in FIG. 2, a memory cell array is constituted by disposing a plurality of memory cells in the form of an array. The control gates of plural (n+1 in FIG. 2) flash memories are connected to word lines (WL0 to WLn) and the drains of plural (m+1 in FIG. 2) flash memories are connected to bit lines (BL0 to BLm). In case of FIG. 2, the memory cell array is constituted of (n+1)×(m+1) flash memories.

Because in the memory cell array constituted of plural memory cells, there can coexist plural memory cells each having a different threshold voltage, these threshold voltages have distributions of the same quantity as the memory cells.

These threshold voltage states are shown in FIG. 14. FIG. 14 shows the distribution of the threshold voltage of each memory cell in a memory cell array in which the aforementioned flash memory cells are arranged. The abscissa axis indicates the threshold voltage of a memory cell and the ordinate axis indicates the quantity of memory cells within the memory cell array having a threshold voltage. In FIG. 14, a distribution of 4.5 V or more (threshold voltage range) in threshold voltage indicates a memory cell in a programmed state and a distribution of less than 3 V (threshold voltage range) in threshold voltage indicates a memory cell in an erased state. If the threshold voltage of the flash memory cell belongs to any one of the two threshold voltage ranges shown in FIG. 14, apparently it is possible to distinguish the two memory states with a single flash memory cell.

To read out the memory state of such a memory cell, Vdr (e.g., 1 V) is applied to the drain and Vgr (e.g., 5 V) is applied to the control gate. For example, if the threshold voltage is in the erased state and within a low threshold voltage range, a current flows to the memory cell and it is determined that data is "1". On the other hand, if the threshold voltage is in a program state and within a high threshold voltage range, no current flows to the memory cell and it is determined that data is "0".

In the programming operation sequence of the ETOX type flash memory, as a reading step for verifying whether or not threshold voltage is changed to the requested threshold voltage range, that is, whether or not program is made successfully, Vgv (e.g., 5 V) is applied to the control gate while Vdv (e.g., 1 V) is applied to the drain so as to read out data and then, the programming verification is carried out by comparing this with a predetermined reference voltage.

In the ETOX type flash memory, a multi-valued memory, which is larger than a bit (two-value) can be achieved in a single memory cell by providing three regions or more of the threshold voltage ranges shown in FIG. 14. As the method for the multi-value of setting data of three values or more, an occasional programming method of executing programming and verification repeatedly from a low state in threshold voltage range to a higher state is generally adopted. This is described, for example, in one of the following documents. The first document is "A Double-Level-Vth Select Gate Array Architecture for Multilevel NAND Flash Memories" IEEE Journal of Solid-State Circuits, Vol 31, No. 4, April 1996. The second document is "A 117-mm$^2$ 3.3-V Only 128-Mb Multilevel NAND Flash Memory for Mass Storage Applications" IEEE Journal of Solid-State Circuits, Vol. 31, No. 11, November 1996. The third document is "40-mm$^2$ 3-V-Only 50-MHz 64-Mb 2-b/cell CHE NOR Flash Memory" IEEE Journal of Solid-State Circuits, Vol. 35, No. 11, November 2000.

FIG. 4 shows an example of threshold voltage distribution in case where four regions are provided for the threshold voltage ranges. As shown in FIG. 4, 2-bit storage states "11", "10", "01", "00" are allocated in order from the lowest level of the threshold voltage. The relation between the four threshold voltage ranges shown in FIG. 4 and the quantity of electrons injected into the floating gate of the flash memory cell is shown in FIG. 15.

As the quantity of electrons within the floating gate increases, the threshold voltage of the flash memory cell increases. That is, a state in which there are no electrons (few electrons) in the floating gate is a state in which the threshold voltage is lowest (memory state "11" here (data "11" in FIG. 4)) and the threshold voltage range of the memory cell is less than 3.0 V. A state in which a larger number of electrons are injected into the floating gate than the memory state "11" so that the threshold voltage range of the flash memory cell is 3.7 V to 4.2 V is assumed to be memory state "10" (data "10" in FIG. 4). A state in which a larger number of electrons are injected into the floating gate than the memory state "10", so that the threshold voltage range of the flash memory is 4.7 V to 5.2 V is assumed to be memory state "01" (data "01" in FIG. 4). A state in which a larger number of electrons are injected into the floating gate than the memory state "01" so that the threshold voltage range is more than 5.7 V is assumed to be memory state "00" (data "00" in FIG. 4).

FIG. 16 is a flow diagram showing a conventional occasional programming sequence for a case of storing four-values into a single memory cell. FIG. 17 expresses an operation following the programming sequence shown in FIG. 16 in time series with the word line voltage and bit line voltage. The waveform of each rectangle in FIG. 17 represents the word line voltage and bit line voltage in both operations for programming and verification and, in FIGS. 16 and 17, like step numbers are attached to corresponding operation steps.

Assume that the threshold voltage in the initial state of the memory cell is within a threshold voltage range corresponding to the memory state "11". Then, assume that the word line voltage for setting this memory cell in a threshold voltage range corresponding to the memory state "10" is Vg10, the word line voltage for setting in a threshold voltage range of the memory state "01" is Vg01 and the word line voltage for setting in a threshold voltage range of the memory state "00" is Vg00. Consequently, the relation among the respective word line voltages is Vg10<Vg01<Vg00. Assuming that the threshold voltage after the control gate of a memory cell is programmed with Vgp is Vt as described in the non-patent document 3, if the program is made by increasing a voltage to be applied to the control gate by only ΔVgp, the threshold voltage of the memory cell is increased by only ΔVgp. That is, to increase the threshold voltage of the memory cell, it is necessary to increase a voltage to be applied to the control gate by just the amount equal to the increase in the threshold voltage.

The conventional occasional programming sequence will be described with reference to FIG. 16. When programming the memory cell to memory state "00" under conditions in which the memory state "11" is an initial state of the memory cell (ST1), first, the word line voltage is set to Vg10 and a waiting time is held until the voltage is stabilized and then, a voltage pulse having a pulse width Wp (e.g., 1 μsec) is applied to the bit line at a voltage of an amplitude Vdp (e.g., 5 V) so as to program to the memory state "10" (ST2). Then, the word line voltage is changed over to a verification voltage Vgv and the bit line voltage is changed over to a verification voltage Vdv. After each voltage is stabilized, the memory state "10" is verified by reading operation (ST3). As a result of the verification, whether or not all the programmed memory cells reach a threshold voltage range corresponding to the memory state "10" is determined (ST4) and for a memory cell which does not reach, the word line voltage Vg10 at the programming time is increased by only ΔVg10 (ST5). The programming for applying the word line voltage and the bit line voltage pulse (ST2) and the verification (ST3) are executed again and steps ST2 to ST5 are repeated until the threshold voltages of all the memory cells reach a threshold voltage range corresponding to the memory state "10". Referring to FIG. 17, up to this step corresponds to the "10" programming period.

After the threshold voltages of all the programming target memory cells reach a threshold voltage range corresponding to the memory state "10", the word line voltage is changed over to Vg01 and after the word line voltage is stabilized, a voltage pulse of an amplitude Vdp is applied to the bit line by only a pulse width Wp so as to program to the memory state "01" (ST6). Subsequently, the word line voltage is changed over to a verification voltage Vgv and the bit line voltage is changed over to a verification voltage Vdv. After the respective voltages are stabilized, the memory state "01" is verified by a reading operation (ST7). Like the programming to the memory state "10", until all the programming target memory cells reach a threshold voltage range corresponding to the memory state "01" (determined in ST8), the word line voltage is increased by ΔVg01 (ST9) and by increasing the word line voltage by ΔVg01 (ST9), programming for applying the word line voltage and bit line voltage pulse (ST6) and the verification (ST7) are repeated. Referring to FIG. 17, up to here corresponds to the "01" programming period.

After the threshold voltages of all the programming target memory cells reach a threshold voltage range corresponding to the memory state "01", the word line voltage is changed over to Vg00 and after the word line voltage is stabilized, programming to the memory state "00" is made in the same manner as step ST6 (ST10). Subsequently, the word line voltage is changed over to the verification voltage Vgv and the bit line voltage is changed over to the verification voltage Vdv and after each voltage is stabilized, the memory state "00" is verified by the reading operation (ST1). Then, the word line voltage is increased (ST13) by ΔVg00 each until all the programming target memory cells reach a threshold voltage range corresponding to the memory state "00" (ST12). The programming for applying the word line voltage and the bit line voltage (ST10) and the verification (ST11) are repeated and if the threshold voltages of all the programming target memory cells reach a threshold voltage range corresponding to the memory state "00" (ST13), the programming is completed. Referring to FIG. 17, up to here corresponds to "00" programming period.

As described above, according to the conventional occasional programming sequence, a programming step (ST2 to ST5) for the memory state "10", a programming step (ST6 to ST9) for the memory state "01" and a programming step (ST10 to ST13) for the memory state "00" exist until programming to the memory state "00" is completed. Each programming step is not completed until the threshold voltages of all the programming target memory cells reach a threshold voltage range corresponding to each memory state "10" but the procedure does not proceed to a next programming step. In the meantime, programming is not made to the memory state "00" in part of the programming target memory cell but if programming to the memory state "10" or the memory state "01" occurs, a programming step for the memory state "10" or a programming step for the memory state "10" and "01" is executed to a corresponding memory cell, while a time taken for the programming maximizes when programming to the memory state "00".

If the conventional occasional programming sequence is adopted as a multi-value programming method of the ETOX type flash memory cell, when programming is made from a certain initial state to another memory state, if a different memory state exists in the middle thereof, a verification step is needed for programming into that intermediate memory state so as to complete the programming into the intermediate memory state by step. Consequently, the word line voltage and bit line voltage need to be changed over due to the intermediate verification step, so that a waiting time until these voltages are stabilized is prolonged and a programming time until the programming operation is completed is prolonged, which is an inconvenience to be solved. Further because the quantity of the verifications increases until a final programming is completed, the programming time is further prolonged.

For the memory cell array constituted of plural memory cells, it is necessary to narrow the threshold voltage range corresponding to each memory state in order to secure a sufficient margin at the reading time. Assuming that a countermeasure for setting the word line voltage at a programming time at a low level or narrowing the programming pulse width or any other measure is taken so as to control changes in the threshold voltage at the programming time, the quantities of the programming and verification increase and further the programming time is prolonged, which are problems to be solved.

SUMMARY OF THE INVENTION

Accordingly, the present invention has been achieved in view of the above-described problem and an object of the invention is to provide a method for programming multi-value data quickly into a nonvolatile semiconductor memory device capable of storing three-valued or higher valued data.

To achieve the above-described object, according to an aspect of the present invention, there is provided a programming method of a nonvolatile semiconductor memory device, the nonvolatile semiconductor memory device comprising a memory cell array in which memory cells each having a transistor in which a charge accumulation region is formed between a channel region and a control gate region via insulation film and capable of obtaining three or more memory states including two or more programmed states corresponding to the level of a threshold voltage determined depending on the quantity of charge in the charge accumulation region are arranged in plural quantities each in a row direction and a column direction, while the control gates of the memory cell on the same row are connected to each other so as to form a common word line and the drains of the memory cells on the same column are connected to each other so as to form a common bit line, wherein plural program gate voltages corresponding to each of the two or more programmed states are set up preliminarily and if between a threshold voltage range corresponding to a memory state before programming and a threshold voltage range corresponding to a memory state after programming, there exists at least a threshold voltage range corresponding to other memory state in a programming target memory cell, a first programming step is executed by applying at least a first program gate voltage corresponding to at least one of the other memory states to the word line connected to the programming target memory cell, and applying a predetermined program drain voltage to the bit line connected to the programming target memory cell, then a second programming step is executed by applying a second program gate voltage corresponding to a programmed state after the programming to the word line connected to the programming target memory cell, and applying a predetermined program drain voltage to the bit line connected to the programming target memory cell, and thereafter a verification step of verifying whether or not a program is made in the programming target memory cell is executed. This is a first feature of the programming method of the nonvolatile semiconductor memory device of the present invention.

The programming method of nonvolatile semiconductor memory device of the first feature is a method for programming multi-valued data into a multi-valued memory cell capable of adopting three or more memory states including two or more programmed states and by applying a program gate voltage corresponding to a memory state after programming to the control gate through the word line, the threshold voltage of a programming target memory cell can be set in a threshold voltage range corresponding to an object memory state. Here, because if the threshold voltage before programming of the programming target memory cell is low and the threshold voltage after the programming is high, the applied program gate voltage is increased, an excessive drain current flows to the memory cell so that consumption current at the programming time, particularly its peak current increases. In order to avoid this phenomenon, if between the threshold voltage range corresponding to the memory state before programming and the threshold voltage range corresponding to the memory state after the programming, at least one threshold voltage range corresponding to other memory state exists, gradual programmings are executed after programming into other memory state is executed so as to reach a final object programmed state. However, because according to the programming method of the present invention, even if the programming into the other memory state is executed, its verifying operation is not executed but programming operation to reach the final object programmed state is executed continuously, a delay time accompanied by an intermediate verifying operation can be avoided, so that the programming time until the final programming is completed can be reduced largely. Further, because even if the intermediate verifying operation is omitted, a corresponding program gate voltage is applied regardless of whether the programming to the other memory state existing intermediately is complete or incomplete, the threshold voltage of the memory cell increases securely. Consequently, the suppression effect of the consumption current is exerted sufficiently and additionally, the verifying operation to the final programmed state is carried out securely, so that the threshold voltage after the programming can be included in a threshold voltage range corresponding to the object memory state.

Here, if the threshold voltage before a programming of a programming target memory cell is in the lowest threshold voltage range, the worst condition arises in viewpoints of consumption current. However, even if the threshold voltage before the programming is in the lowest threshold voltage range, if the intermediate other memory state increases, the first program gate voltage in the first programming step increases, so that the threshold voltage of the programming target memory cell rises gradually, thereby eliminating such a problem that an excessive drain current may flow. Further, as the memory states which a single memory cell can adopt increases, the intermediate other memory states increase. Consequently, although the quantity of applications of the first program gate voltage in the first programming step increases, because the verification step is fixed to a single time for the first programming step and the second programming step regardless of the quantity of memory states or multi-value level, the reduction effect of the programming time is intensified, although the programming time increases as the multi-value level is intensified.

According to the programming method of the present invention, if it is determined that in the aforementioned verification step, the programming target memory cell is not subjected to programming, at least the second programming step of the first programming step and the second programming step is executed again.

According to the programming method of the present invention, finally the threshold voltage of the programming target memory cell can be included in a threshold voltage range corresponding to an object memory state. That is, by executing at least the second programming step of the first programming step and the second programming step until it can be verified that a programming target memory cell is subjected to programming (the threshold voltage is set within a threshold voltage range corresponding to an object memory state) in the verification step repeatedly, finally, the threshold voltage of the programming target memory cell can be included within a threshold voltage range corresponding to an object memory state unless the corresponding memory cell is a completely faulty cell. Because the threshold voltage before programming rises in the first programming step of the first time, even if the first programming step is omitted in a second or following programming, a sufficient suppression effect of consumption current can be expected.

If there exist plural programming target memory cells on the same word line, when it is determined that no programming is done in the verification step, naturally, the final programmed state of a cell can be in an intermediate other memory state while other memory cells are in the final programmed state. Thus, because at least the first program gate voltage is applied to the other memory cells in the first programming step, both the first-programming step and the second programming step can be executed. However, if a flash memory cell is presumed, because the first program gate voltage is lower than the second program gate voltage, execution of the first programming step does not affect changes in the threshold voltage largely.

According to the programming method of the present invention, the first program gate voltage or the second program gate voltage applied in at least one of the first programming step and the second programming step of a second time or following executed again is set higher than each voltage value applied at the first time in the first programming step or the second programming step.

Because according to the programming method of the present invention, the program gate voltage is set high in the first programming step or the second programming step of the second time or following executed again, the quantity of repetition for the first programming step or the second programming step can be suppressed to a low level by enhancing the programming to a memory cell difficult to be subjected to programming. Consequently, the programming time restricted by the memory cell difficult to be subjected to programming can be reduced.

According to the programming method of the present invention, the first program gate voltage or the second program gate voltage applied in at least one of the first programming step and the second programming step of a second time or following executed again is set longer in terms of a programming period applied to the programming target memory cell at the same time when the program drain voltage is applied than the programming period of the first time.

Because according to the programming method of the present invention, the substantial application period of the gate voltage in the first programming step is set long in the first programming step or the second programming step of the second time or following executed again, the quantity of repetitions for the first programming step or the second programming step can be suppressed to a low level by enhancing the programming to a memory cell difficult to be subjected to programming. The programming time restricted by the memory cell difficult to be subjected to programming can be reduced totally.

To achieve the above-described object, according to another aspect of the present invention, there is provided a programming method of a nonvolatile semiconductor memory device, the nonvolatile semiconductor memory device comprising a memory cell array in which memory cells each having a transistor in which a charge accumulation region is formed between a channel region and a control gate region via insulation film and capable of obtaining three or more memory states including two or more programmed states corresponding to the level of a threshold voltage determined depending on the quantity of charge in the charge accumulation region are arranged in plural quantities each in a row direction and a column direction, while the control gates of the memory cell on the same row are connected to each other so as to form a common word line and the drains of the memory cells on the same column are connected to each other so as to form a common bit-line, wherein plural program gate voltages corresponding to each of the two or more programmed states are set up preliminarily and if two or more programming target memory cells connected to the same word line are programmed simultaneously, a programming step is executed by applying two or more of the program gate voltages corresponding to two or more programmed states including programmed state after a programming successively in order from a lower voltage value to the word line connected to two or more of the programming target memory cells, and by applying a predetermined program drain voltage to at least one of the bit lines connected to the programming target memory cell at the same time when each of the program gate voltages is applied, and thereafter a verification step for verifying whether or not a program is made into two or more of the programming target memory cells is executed. This is a second feature of the programming method of nonvolatile semiconductor memory device of the present invention.

The programming method of nonvolatile semiconductor memory device of the second feature is a method for programming multi-valued data into a multi-valued memory cell capable of adopting three or more memory states including two or more programmed states and by applying a program gate voltage corresponding to a memory state after programming to the control gate through the word line, the threshold voltage of a programming target memory cell can be set in a threshold voltage range corresponding to an object memory state. In a memory cell in which the threshold voltage range corresponding to an object memory state is higher, the programming time of each memory cell is longer. In the given memory cell, application of a program gate voltage corresponding to a programmed state after programming of at least other memory cell is the first programming step and consequently, like the programming method of the first feature, the reduction effect of the programming time and the reduction effect of consumption current are exerted at the same time. As a result, for all the programming target memory cells subjected to programming at the same time, the programming time can be reduced.

Even if all two or more programming target memory cells are in the same programmed state after the programming, because two or more program gate voltages are applied successively in order from a lower voltage, a program gate voltage applied first becomes the first programming step in the programming method of the first feature by setting a program gate voltage which is lower, lower than a program gate voltage corresponding to the programmed state after programming. Consequently, like the programming method of the first feature, the reduction effect of the programming time and the reduction effect of consumption current are exerted at the same time.

According to the programming method of the present invention, two or more of the program gate voltages applied in the programming step include the program gate voltage having a lower voltage value than the program gate voltage corresponding to the programmed state after a program.

According to the programming method of the present invention, a program gate voltage of a lower voltage value than a program gate voltage corresponding to the programmed state after programming is applied to a memory cell having a lower threshold voltage range corresponding to an object memory state in two or more programming target memory cells. Thus, that application becomes the first programming step in the programming method of the first feature, so that like the programming method of the first feature, the reduction effect of consumption current is exerted. For a memory cell having a higher threshold voltage range corresponding to the object memory state also, the reduction effect of consumption current is exerted.

According to the programming method of the present invention, for the bit line on which the predetermined program drain voltage is applied in the programming step, the threshold voltage range corresponding to the storage condition before the predetermined program drain voltage is applied of the programming target memory cell connected to the bit line is lower than the threshold voltage range corresponding to a programmed state which determines the program gate voltage applied when the predetermined program drain voltage is applied.

Because according to the programming method of the present invention, a predetermined program drain voltage is applied only when the threshold voltage of a programming target memory cell increases, the programming target memory cell whose threshold voltage has already settled within a threshold voltage range corresponding to an object memory state is protected from an excessive programming over an appropriate threshold voltage range with a program gate voltage and a program drain voltage applied.

According to the programming method of the present invention, if it is determined that no program is made into at least one of the programming target memory cells in the verification step, the programming step is executed again.

According to the programming method of the present invention, finally, all the threshold voltages of two or more programming target memory cells can be settled in a threshold voltage range corresponding to an object memory state.

According to the programming method of the present invention, the memory cell determined to be subjected to programming in the verification step is excluded from the programming target memory cell in the programming step of the second time or following to be executed again.

According to the programming method of the present invention, by executing the programming step of the second time or following to only a programming target memory cell not yet subjected to programming, consumption current can be reduced without a necessity of charging/discharging the bit line connected to the programming target memory cell already subjected to programming, thereby preventing the above-described excessive programming.

According to the programming method of the present invention, in the programming step of the first time and the second time or following to be executed again, two or more of the program gate voltages applied in the programming step of at least the first time include the program gate voltage having a lower voltage value than the program gate voltage corresponding to a programmed state after program.

Because according to the programming method of the present invention, a program gate voltage corresponding to a programmed state is applied gradually to all two or more programming target memory cells at least once, such a phenomenon that an excessive drain current flows to the memory cell thereby preventing consumption current at the programming time, particularly its peak current from increasing can be blocked. Further, in a programming step of the second time or following, application of a program gate voltage lower than a program gate voltage corresponding to a programmed state after program can be cancelled arbitrarily, thereby leading to reduction in the programming time.

To achieve the previously described object, according to still another aspect of the present invention, there is provided a nonvolatile semiconductor memory device comprising: a memory cell array in which memory cells each having a transistor in which a charge accumulation region is formed between a channel region and a control gate region via insulation film and capable of obtaining three or more memory states including two or more programmed states corresponding to the level of a threshold voltage determined depending on the quantity of charge in the charge accumulation region are arranged in plural quantities each in a row direction and a column direction, while the control gates of the memory cell on the same row are connected to each other so as to form a common word line and the drains of the memory cells on the same column are connected to each other so as to form a common bit line; programming means for applying selectively plural program gate voltages set preliminarily corresponding to each of the two or more programmed states to the word line connected to the programming target memory cell while applying a predetermined program drain voltage to the bit line connected to the programming target memory cell; and verifying means for verifying whether or not the programming target memory cell is programmed, wherein if between a threshold voltage range corresponding to a memory state before programming and a threshold voltage range corresponding to a memory state after programming, there exists at least a threshold voltage range corresponding to other memory state in a programming target memory cell, a first programming step is executed by applying at least a first program gate voltage corresponding to at least one of the other memory states to the word line connected to the programming target memory cell, and applying a predetermined program drain voltage to the bit line connected to the programming target memory cell, then a second programming step is executed by applying a second program gate voltage corresponding to the programming data, and applying a predetermined program drain voltage to the bit line connected to the programming target memory cell, and thereafter a verification step of verifying whether or not a program is made in the programming target memory cell is executed. This is a first feature of the nonvolatile semiconductor memory device of the present invention.

According to the nonvolatile semiconductor memory device of the present invention of the above-mentioned first feature, the programming means executes the first programming step and the second programming step based on the programming method and the verifying means executes a verification step after the first programming step and the second programming step. Consequently, the operation and effect of the programming method of the present invention can be exerted thereby reducing the programming time largely.

To achieve the previously described object, according to yet still another aspect of the present invention, there is provided a nonvolatile semiconductor memory device comprising: a memory cell array in which memory cells each having a transistor in which a charge accumulation region is formed between a channel region and a control gate region via an insulation film and capable of obtaining three or more memory states including two or more programmed states corresponding to the level of a threshold voltage determined depending on the quantity of charge in the charge accumulation region are arranged in plural quantities each in a row direction and a column direction, while the control gates of the memory cell on the same row are connected to each other so as to form a common word line and the drains of the memory cells on the same column are connected to each other so as to form a common bit line; programming means for applying selectively plural program gate voltages set preliminarily corresponding to each of the two or more programmed states to the word line connected to the programming target memory cell while applying a predetermined program drain voltage to the bit line connected to the programming target memory cell; and verifying means for verifying whether or not the programming target memory cell is programmed, wherein if two or-more programming target memory cells connected to the same word line are programmed simultaneously, the programming means executes a programming step in which by applying two or more of the program gate voltages corresponding to two or more programmed states including a programmed state after a programming to the word line connected to two or more of the programming target memory cells in order from a lower voltage value, and a predetermined program drain voltage is applied to at least one of the bit lines connected to the programming target memory cells at the same time when each of the program gate voltages is applied, and the verifying means executes a verification step for verifying whether or not two or more of the programming target memory cells are programmed. This is a second feature of the nonvolatile semiconductor memory device of the present invention.

Because in the nonvolatile semiconductor memory device of the present invention of the above-described second feature, the programming means executes a programming step based on the programming method of the present invention and the verifying means executes a verification step after the programming step, the operation and effect of the programming method of the present invention can be exerted, thereby reducing the programming time largely.

According to the nonvolatile semiconductor memory device of the present invention, the verifying means includes plural sense amplifiers corresponding to the quantity of the programmed states which the memory cell can obtain for every verifying object memory cell executing the verification step at the same time and a reference voltage of a different inherent voltage value is applied to each of the plural sense amplifiers.

According to the nonvolatile semiconductor memory device of the present invention, the verifying means includes a sense amplifier for every verifying object memory cell executing the verification step at the same time and depending on the quantity of the programmed states which the memory cell can obtain, the plural reference voltages each having a different voltage value is used selectively for the sense amplifier through a switch circuit.

According to the nonvolatile semiconductor memory device of the present invention, by adopting the lower limit value of the threshold voltage range corresponding to an object memory state as a reference voltage of a sense amplifier, the threshold voltage of a programming target memory cell is raised due to applications of the program gate voltage and program drain voltage, so that it can be determined that a given threshold voltage range is reached.

Consequently, the verifying means is capable of verifying whether or not the programming target memory cell is programmed.

BRIEF DESCRIPTION OF THE DRAWINGS

FIG. 19 is a table on passage time in which programming time according to the programming method of the nonvolatile semiconductor memory device of the present invention is distributed depending on the voltage levels of the word line voltage and bit line voltage and a table showing a comparison between the programming time of the method of the present invention and the conventional programming method.

DETAILED DESCRIPTION OF THE INVENTION

Preferred embodiments of the nonvolatile semiconductor memory device according to the present invention (hereinafter, referred to as the "inventive device") and its programming method according to the present invention (hereinafter, referred to as the "inventive method") will be described with reference to the accompanying drawings.

First Embodiment

Figure 1:
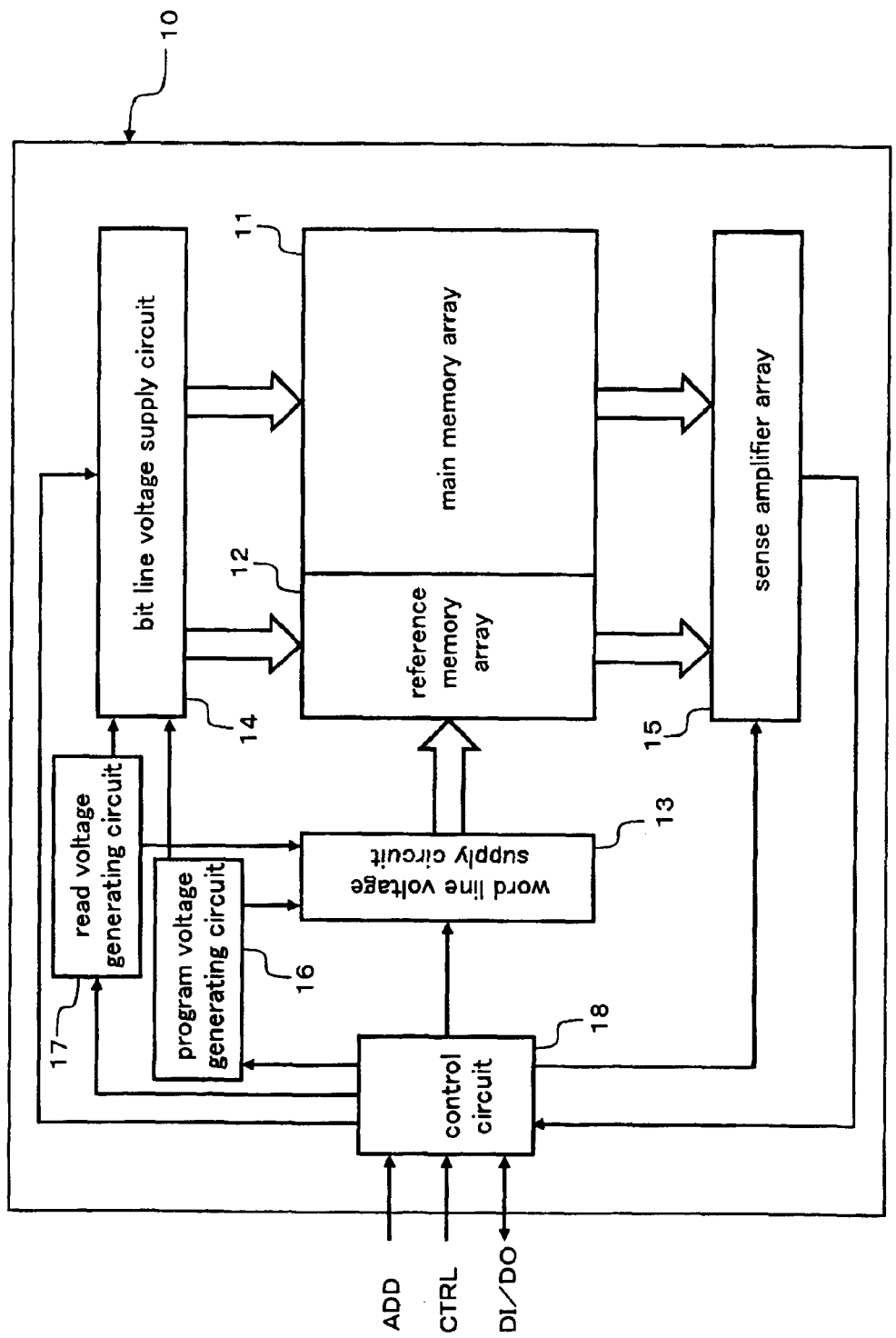
FIG. 1 is a block structure diagram showing a functional block structure according to an embodiment of the nonvolatile semiconductor memory device of the present invention.

FIG. 1 is a block structure diagram showing a functional schematic structure of the embodiment of an inventive device 10. In the meantime, descriptions about the details of peripheral circuits such as input circuits for plural address input signals (ADD in the same figure), plural data input signals (DI in the same figure), plural control signals (CTRL in the same figure) and the like, output circuit for plural data output signals (DO in the same figure), decoder circuit for address input signals and the like are omitted because they are the same as the nonvolatile semiconductor memory device like a well known flash memory. FIG. 1 depicts mainly a circuit portion relating to a programming operation of a main memory array 11 (hereinafter referred to as memory array 11) of the inventive device 10.

As shown in FIG. 1, the inventive device 10 comprises a memory array 11, a reference memory array 12, a word line voltage supply circuit 13 for supplying a word line voltage to the word lines of the memory array 11 and the reference memory array 12, a bit line voltage supply circuit 14 for supplying a bit line voltage to the bit lines of the memory array 11 and the reference memory array 12, a sense amplifier array 15 constituted of plural sense amplifiers which compare a read-out voltage read out from a selected bit line of the memory array 11 with a reference voltage read out form a selected bit line of the reference memory array 12 and verify the programmed states of selected plural memory cells of the memory array 11, a program voltage generating circuit 16 for generating a program gate voltage supplied as a word line voltage and a program drain voltage supplied as a bit line voltage, a read voltage generating circuit 17 for generating a verify gate voltage supplied as a word line voltage and a verify drain voltage supplied as a bit line voltage and a control circuit 18 for controlling the operations of the respective circuits 13 to 17.

Figure 2:
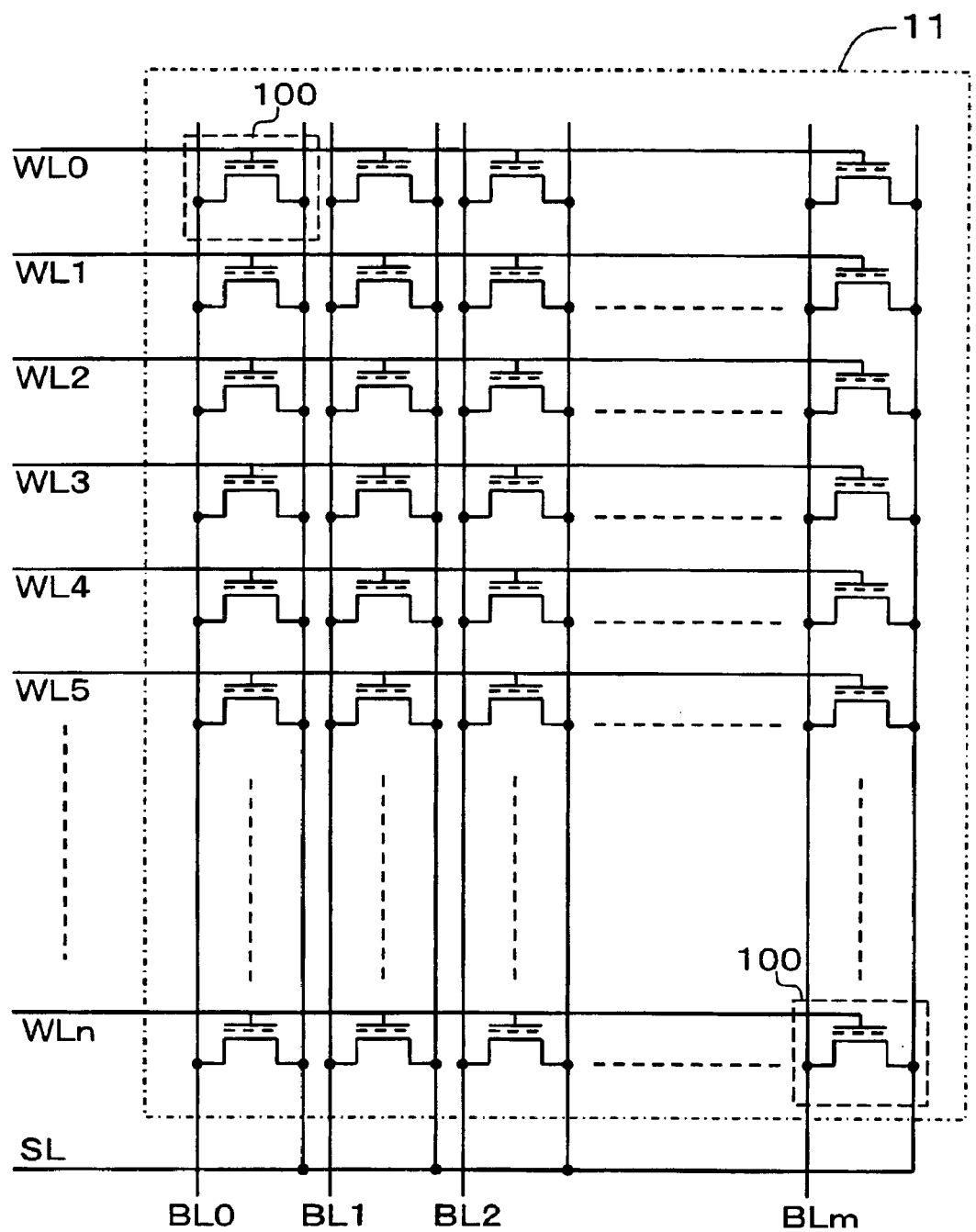
FIG. 2 is a circuit diagram of a memory cell and a memory cell array according to the embodiment of the nonvolatile semiconductor memory device of the present invention.
Figure 12A:
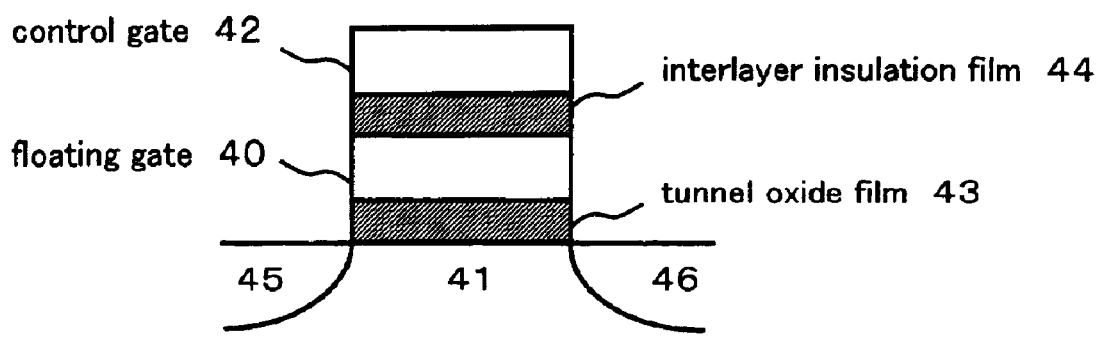
FIGS. 12A and 12B are a sectional view showing schematically the structure of the memory cell transistor in the flash memory as the nonvolatile semiconductor memory device and its equivalent circuit diagram.
Figure 12B:
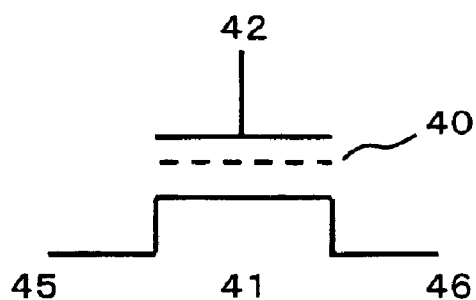
Figures 13A, 13B:
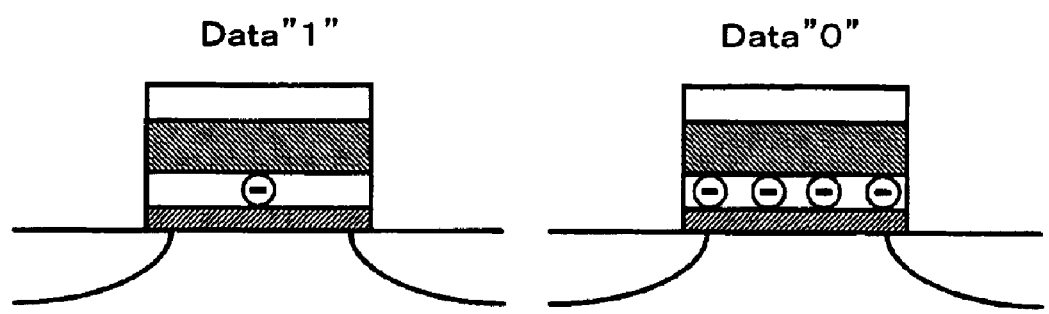
FIGS. 13A and 13B are diagrams each showing the state of electrons in the floating gate of a memory cell in a binary flash memory as the nonvolatile semiconductor memory device.
Figure 14:
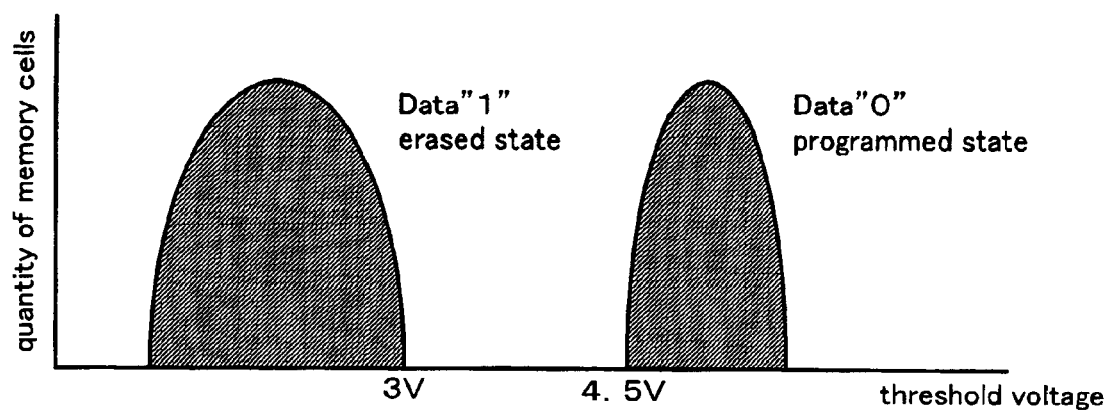
FIG. 14 is a diagram showing the distribution of the threshold voltage of the memory cell transistor in the binary flash memory as the nonvolatile semiconductor memory device.
Figure 15:
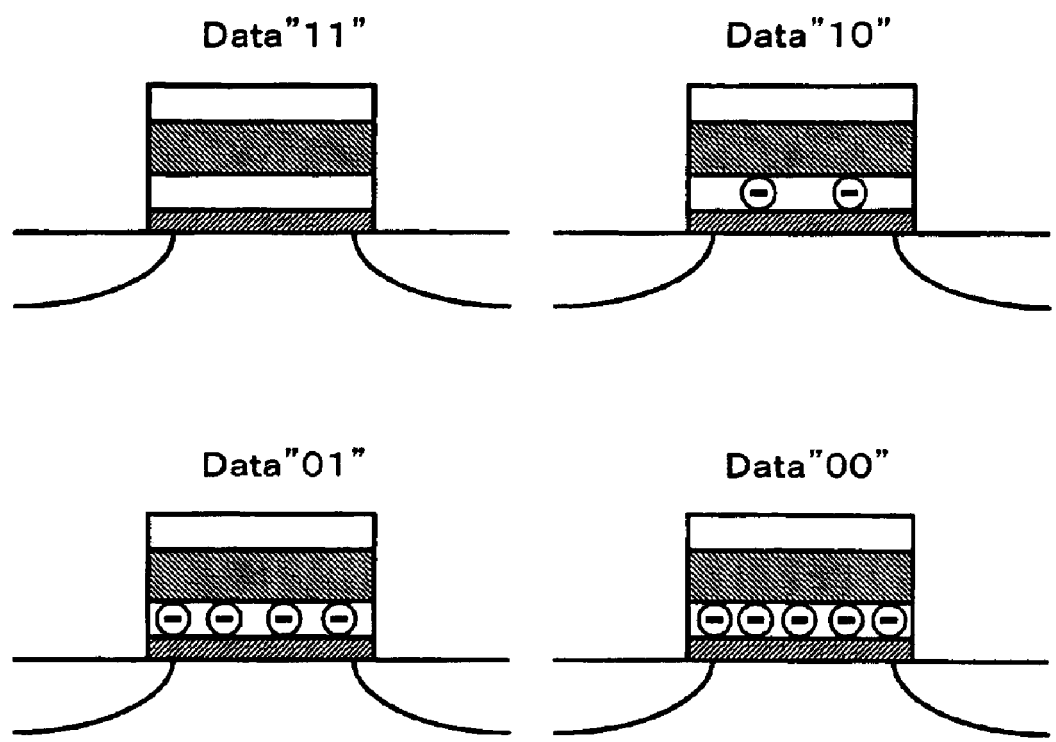
FIG. 15 is a diagram showing the state of electrons in the floating gate of the memory cell in the four-valued flash memory as the nonvolatile semiconductor memory device.

In the memory cell 11, as shown in FIG. 2, plural memory cells 100 are arranged in the directions of the row and column and the control gates of the memory cells on the same row are connected to each other so as to form common word lines WL0 to WLn. Then, by connecting the drains of the memory cells 100 on the same column, common bit lines BL0 to BLm are formed and the sources of the respective memory cells 100 are connected to each other to form common source lines SL. User's data is memorized in the memory array 11. The memory cell 100, as shown in FIG. 12, has the same transistor structure as a floating gate type flash memory cell such as a conventional ETOX type flash memory, which is constituted of a transistor in which a floating gate 40 functioning as a charge accumulation region through insulation films 43, 44 is formed between a channel region 41 and a control gate 42. Three or more memory states including two or more programmed states can be obtained depending on the level of the threshold voltage of a transistor determined corresponding to the charge quantity of the floating gate 40.

The reference memory array 12 is constituted by arranging the flash memory cells 100 in the form of an array as shown in FIG. 2. The reference memory array 12 supplies a reference voltage to the sense amplifier through verification of the programming operation and normal array reading operation. Deterioration of reading margin is prevented by using a common word line to the memory array 11. The memory cell of each row of the reference memory array 12 is programmed to a predetermined threshold voltage specialized for array reading, programming verification and erase verification.

In programming step, the word line voltage supply circuit 13 selects a program gate voltage generated by the program voltage generating circuit 16 under a control of the control circuit 18 according to a programming procedure described later and supplies it to a word line selected by an address input signal. In verification step, it supplies a verify gate voltage generated by the read voltage generating circuit 17 to the same selected word line. In programming step, the bit line voltage supply circuit 14 supplies a program drain voltage generated by the program voltage generating circuit 16 to a bit line selected by an address input signal as a voltage pulse having a predetermined pulse width under a control of the control circuit 18. In verification step, it supplies a verify drain voltage generated by the read voltage generating circuit 17 to the same selected bit line.

In the verification step, verify gate voltage and verify drain voltage generated by the read voltage generating circuit 17 are applied to memory cells selected of the memory array 11 and reference memory array 12 by the word line voltage supply circuit 13 and the bit line voltage supply circuit 14. A read voltage of the memory array 11 and a read voltage (reference voltage) of the reference memory array 12 are connected to the respective sense amplifiers of the sense amplifier arrays 15 and outputs of the respective sense amplifiers are outputted to the control circuit 18 and the verification on whether or not programming is done is performed in the control circuit 18. The result of the verification is used for control of a programming sequence in the method of the present invention. Its detail will be described later. On the other hand, upon normal reading, the output of each sense amplifier is connected to an output buffer circuit (included by the control circuit in FIG. 1) and outputted to an external output terminal as data output.

The control circuit 18 receives a programming signal (a programming instruction by control signal input or command input based on data input signal) from outside, programming sequence control (change-over between programming step and verification step) according to the method of the present invention, setting of the word line voltage and bit line voltage, adjustment of application time and the like are carried out. Further, a memory cell for applying a programming pulse (bit line voltage) based on programming data or verification result is selected.

The method of the present invention concerns a method of programming multi-value data to the memory cell array, which is controlled by the control circuit 18 in FIG. 1. Hereinafter, the method of the present invention for achieving a reduction in programming time presuming a case where the multi-value level is four-valued will be described with reference to a flow chart in FIG. 3 for simplification of the description.

Figure 4:
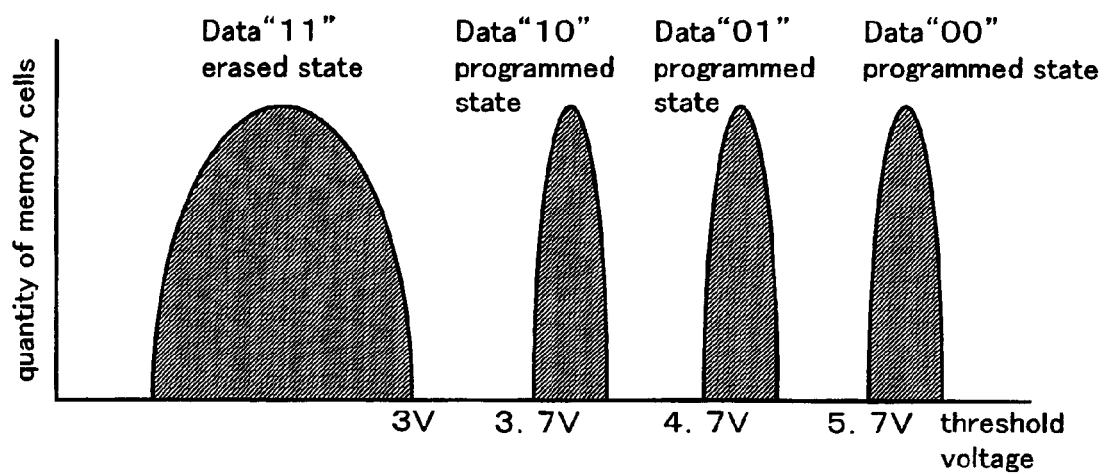
FIG. 4 is a diagram showing the distribution of the threshold voltage in the memory cell transistor in a four-valued flash memory as the nonvolatile semiconductor memory device.
Figure 5:
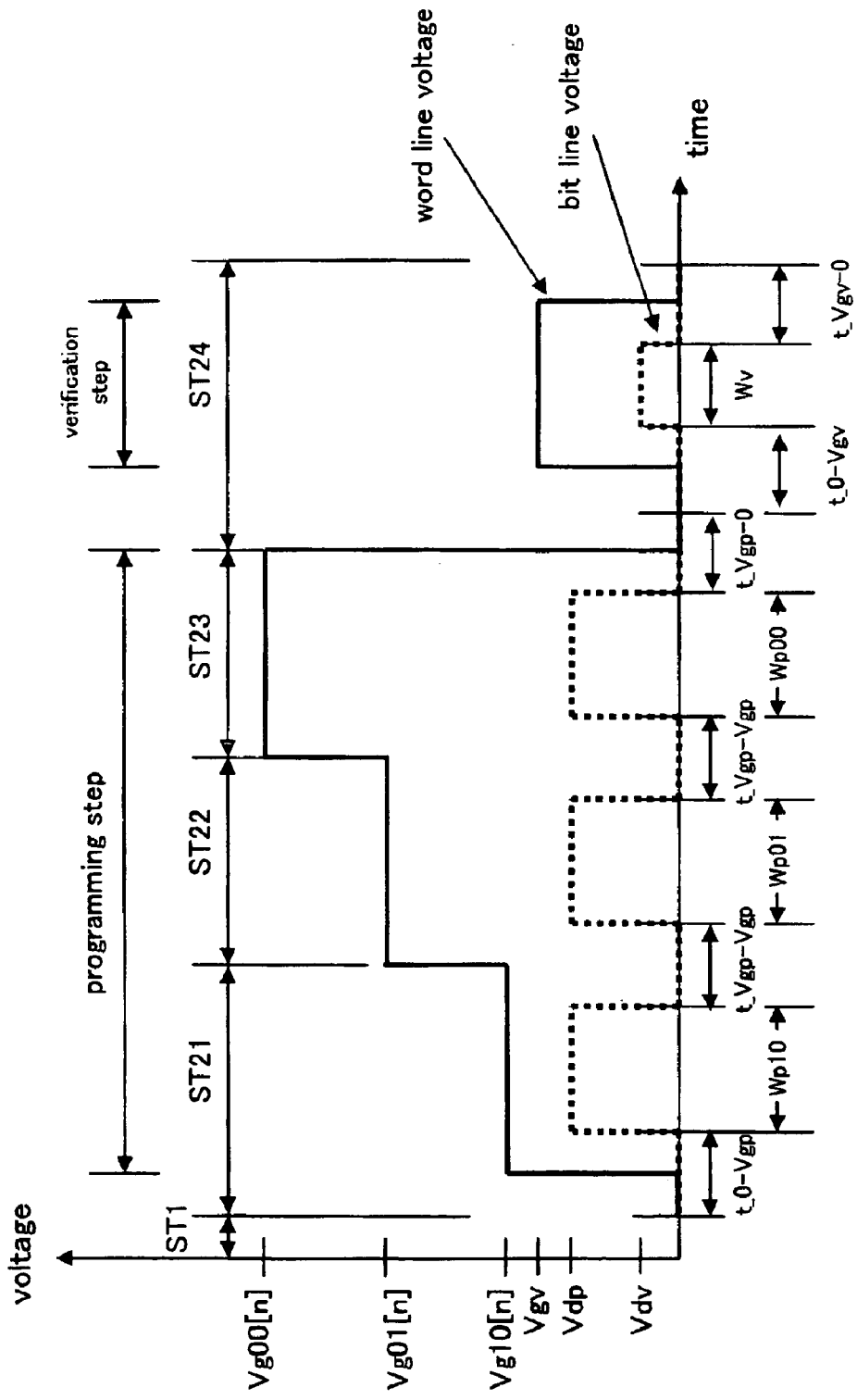
FIG. 5 is a diagram showing changes in voltage in the word line and bit line in a programming step and a verification step according to the first and second embodiments of the programming method of the nonvolatile semiconductor memory device of the present invention.

As shown in FIG. 4, the memory states of the memory cell correspond to four-valued (2 bits) memory states "11" (e.g., a range of threshold voltage of 1.0 V or more to less than 3.0 V), "10" (e.g., a range of threshold voltage of 3.7 V or more to less than 4.2 V), "01" (e.g., a range of threshold voltage of 4.7 or more to less than 5.2 V) and "00" (e.g., a range of threshold voltage of 5.7 V or more to less than 6.2 V) in order from a low state in terms of threshold voltage range. FIG. 5 shows the voltage pulse waveforms of the word line voltage and bit line voltage to be applied to the control gate and drain of each memory cell. A bold solid line in FIG. 5 indicates a word line voltage and a dotted line indicates a bit line voltage. Any source (common source line) of each memory cell is grounded during the programming and verification steps.

Figure 3:
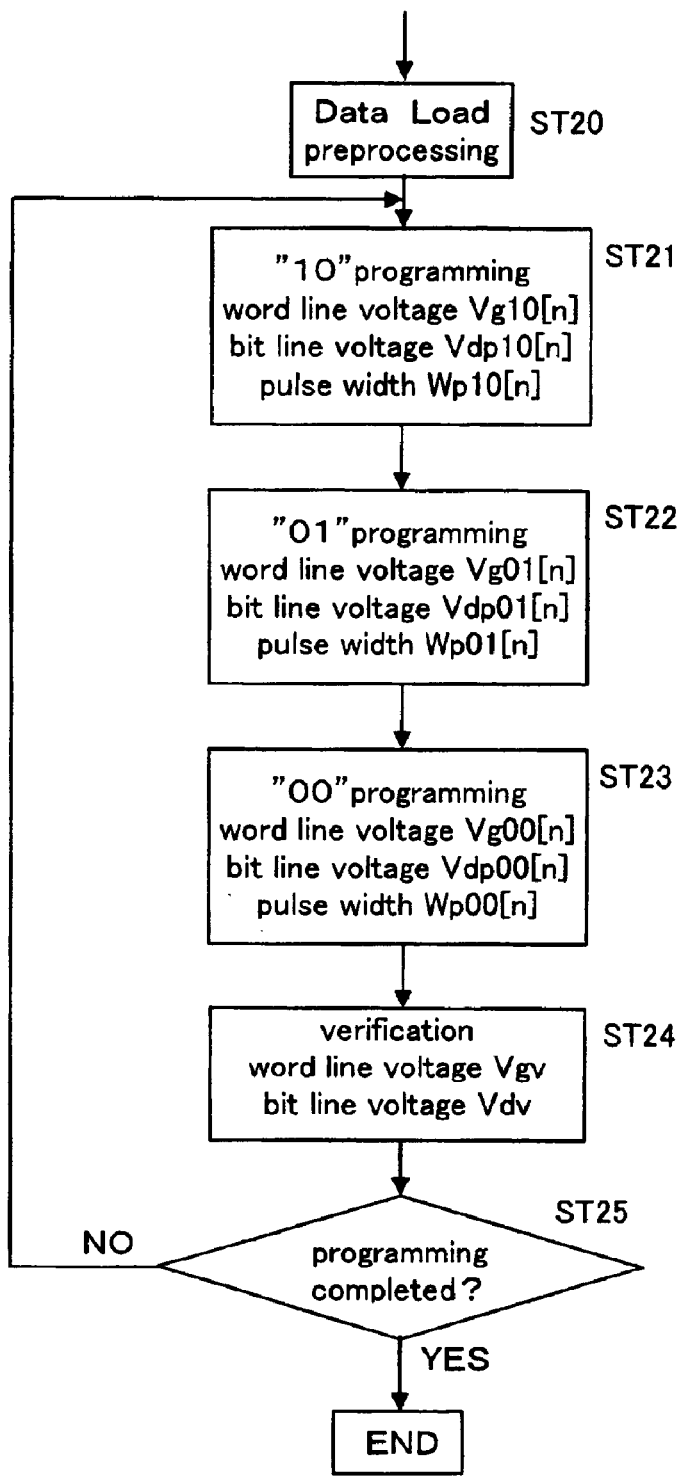
FIG. 3 is a flow chart showing the program sequence according to the first and second embodiments of the programming method of the nonvolatile semiconductor memory device of the present invention.

Hereinafter, the programming sequence to the memory cell and memory cell array according to the inventive method will be described with reference to FIGS. 3 to 5. First, an embodiment of the present invention will be described by paying attention to a single memory cell. A case of programming so that the threshold voltage of the memory cell drops into a range of threshold voltage corresponding to the memory state "00" is considered. Although the threshold voltage of the memory cell initial state is permitted to be any memory state of "11", "10", "01" and "00" it is assumed to be a threshold voltage corresponding to the memory state "11". As the initial state of each voltage, for example, it is assumed that the word line voltage is 0 V, the bit line voltage is 0 V and the source voltage is 0 V (the source voltage is fixed to 0 V during programming period) (ST20). Read-in of the programming data (corresponding to a target memory state) ("00" in case of this embodiment) and read-out of a current (prior to programming) memory state of a programming target memory cell ("11" in case of this embodiment) are carried out in a pretreatment stage (ST20).

From this initial state, a programming pulse of pulse width Wp10[n] (e.g., 1 μsec, period of Wp10 in FIG. 5) is applied to the word line with voltage Vg10[n] (e.g., 6 V, period of t_0-Vgp in FIG. 5) and the bit line at an amplitude Vdp10[n] (e.g., 5 V) (ST21). Here, n is 0 or a natural number, which indicates the quantity of sequential rewriting cycles, which will be described later. To explain the programming from the initial state, it is assumed that n=0. After this programming pulse is applied, the threshold voltage of the memory cell rises from less than 3.0 V to near 3.7 V. Meanwhile, the n which indicates the quantity of the rewritings is not related to the quantity n of the word lines WL in the memory array 11 shown in FIG. 2.

Next, the word line voltage is changed over to Vg01[0] (e.g., 7 V) (period of t_Vgp—Vgp in FIG. 5) and a programming pulse having a pulse width of Wp01[0] (e.g., 1 μsec, period of Wp01 in FIG. 5) is applied to the bit line at an amplitude of Vdp01[0] (e.g., 5 V) (ST22). Due to this programming pulse, the threshold voltage of the memory cell rises to near 4.7 V. Further, the word line voltage is changed over to Vg00[0] (e.g., 8 V) (period of t_Vgp—Vgp in FIG. 5) and a programming pulse having a pulse width Wp00[n] (e.g., 1 μsec, period of Wp00 in FIG. 5) is applied to the bit line at an amplitude of Vdp00[0] (e.g., 5 V) (ST23).

At this time, the threshold voltage of a programming target memory cell reaches about 5.7 V. Here, although the word line voltage upon programming into each memory state has a relationship of Vg10[n]<Vg01[n]<Vg00[n] like the conventional programming sequence, the inventive method does not execute verify operation at every application of the programming pulse different form the conventional method. Of the programming step of the present invention consisting of steps ST21 to ST23, particularly the steps ST21, ST22 are designated as first programming step and step ST23 is designated as a second programming step.

Next, after the programming step of steps ST21 to ST23 is completed, the verification step (ST24, ST25) is executed. First, the word line voltage for verify is changed to Vgv (e.g., 5.5 V) and the bit line voltage, is changed over to Vdv (e.g. 1 V) and the programmed state "00" to the memory cell is verified (ST24).

Figure 6:
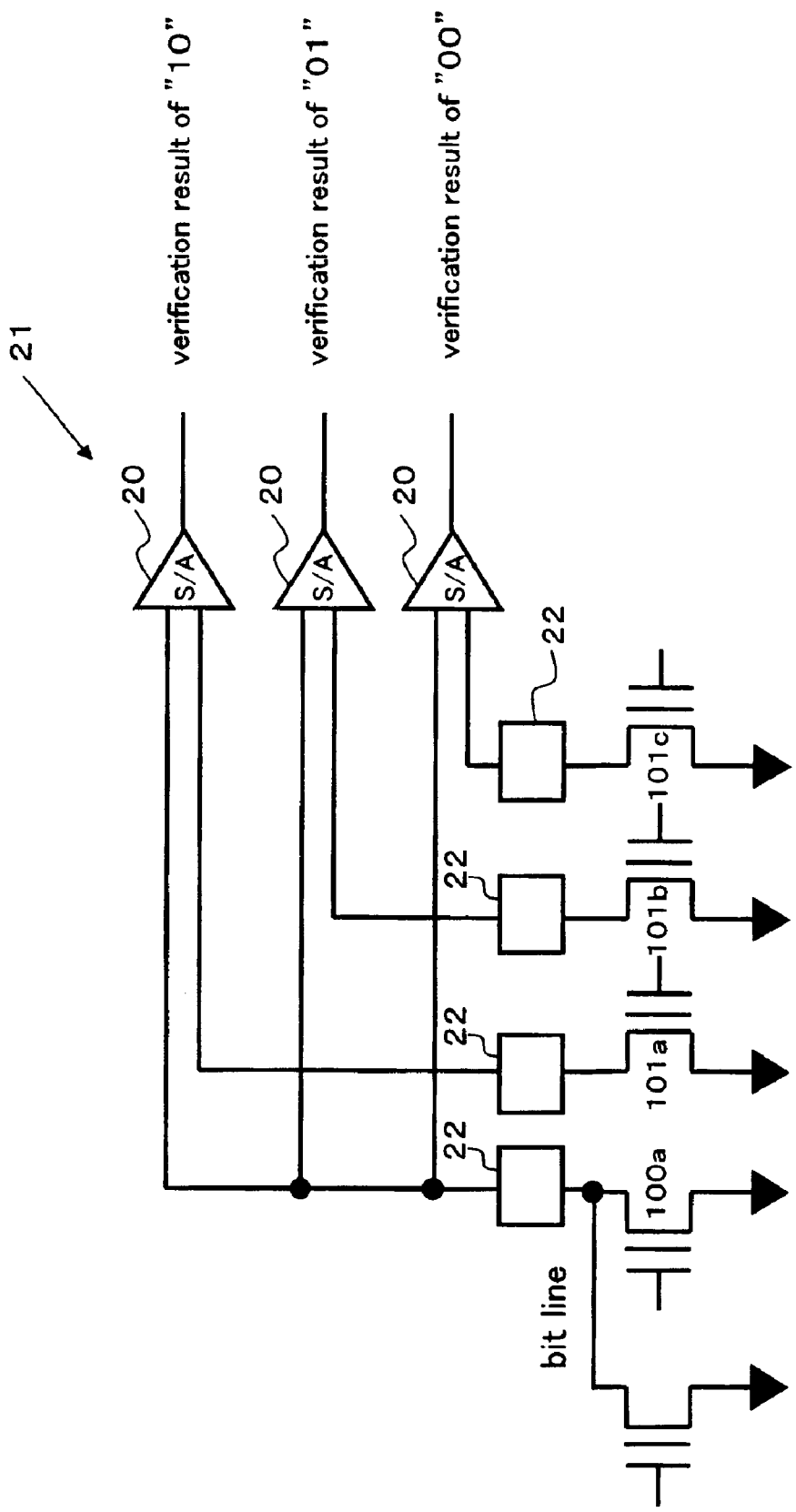
FIG. 6 is a circuit diagram showing an example of a read circuit of the nonvolatile semiconductor memory device of the present invention.

This verification (ST24) is carried out by a reading circuit 21 (equivalent to part of the sense amplifier array 15 in FIG. 1) comprising plural sense amplifiers 20 as shown in FIG. 6. In an example shown in FIG. 6, a bit line connected to a programming target memory cell 100a within the memory array 11 is connected to plural sense amplifiers 20, so that verifications on three programmed states "00", "01", "10" can be carried out. In this reading circuit 21, the bit line is connected to one input of each of the plural sense amplifiers 20 and the sense amplifiers 20 outputs a verification result by comparing with the output voltage (reference voltage) of the verification reference cells 101a to 101c connected to the other inputs Here, the verification reference cell 101a outputs a reference voltage 3.7 V for the programmed state "10", the verification reference cell 101b outputs a reference voltage 4.7 V for the programmed state "01" and the verification reference cell 101c outputs a reference voltage 5.7 V for the programmed state "00". If the reference voltages to be inputted to all the sense amplifiers 20 are the same, that verification aims at verifying only a certain data and if the reference voltages to be inputted to the respective sense amplifiers 20 are different, verifications for verifying plural different data can be carried out at the same time. In the meantime, a circuit block 22 is a bit line selecting circuit for selecting bit lines to be connected to the programming target memory cell 100a and the verification reference cells 101a to 101c and constituted of a transfer gate of NMOS and the like.

Figure 7:
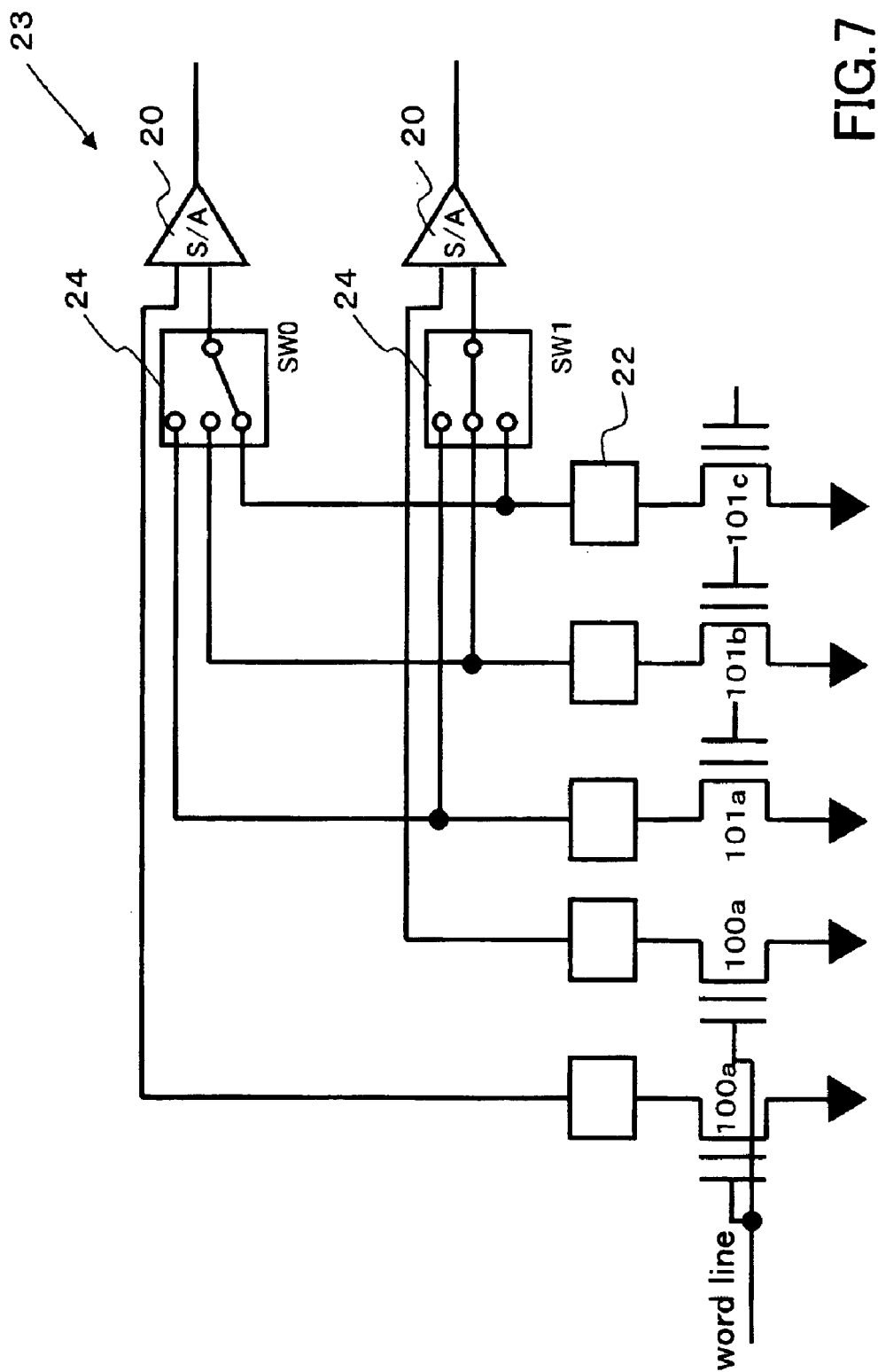
FIG. 7 is a circuit diagram showing another example of the read circuit of the nonvolatile semiconductor memory device of the present invention.

For the above-described verification (ST24), instead of the reading circuit 21 shown in FIG. 6, it is permissible to use for example, a reading circuit 23 (equivalent to part of the sense amplifier 15 in FIG. 1) provided with a single sense amplifier 20 for every programming target memory cell 100a as shown in FIG. 7. In the example shown in FIG. 7, each bit line connected to the programming target memory cell 100a within the memory array 11 is connected to one input of a sense amplifier 20 and by changing over the output voltage (reference voltage) of the verification reference cells 101a to 101c to be connected to the other input in order with a switch circuit 24 and comparing, different memory states programmed into the programming target memory cell 100a on the same word line can be verified.

A verification result of the reading circuit 21 or 23 is outputted to the control circuit 18 and if a verification result passes its criterion (according to this embodiment, the threshold voltage of the programming target memory cell 100a is 5.7 V or more), the word line voltage and the bit line voltage are returned to their initial state under a control of the control circuit 18 and the programming sequence is terminated (ST25, period of t_Vgv-0 in FIG. 5).

If in step ST25, the verification result fails (according to this embodiment, the threshold voltage of the programming target memory cell 100*a* is less than 5.7 V), the processing is returned to step ST21 under a control of the control circuit 18, so that the steps ST21 to ST24 of the programming sequence are repeated. According to the embodiment shown in FIG. 3, the word line voltages Vg10[n], Vg01[n], Vg00[n] (n=1, 2, 3, . . . ) applied to a second or following time are equal to the word line voltage Vg10[0], Vg01[0], Vg00[0] of the first time.

Next, consider a case for programming into an programming target memory cell so that it turns into the memory state of "01". As the initial (prior to programming) memory state, presume "11" or "10". That is, programming from the initial memory state "00" to "01" is inhibited and the programming from the initial memory state "01" to "01" is not substantially carried out in order to prevent an excessive programming. For this embodiment, a case where the initial memory state is "10" will be described.

Like the case of programming into the above-described memory state "00", first, the word line voltage is set to Vg10[0] (e.g., 6 V) and a programming pulse having a pulse width Wp 10[0] (e.g., 1 μsec) is applied to the bit line at an amplitude of Vdp10[0] (e.g., 5 V)(ST21). Next, the word line voltage is changed over to Vg01[0] (e.g. 7 V) and a programming pulse having a pulse width of Wp01[0] (eg., 1 μsec) is applied to the bit line at an amplitude of Vd01[0] (e.g., 5 V) (ST22). Next, although the word line voltage is set to Vg00[0] (e.g., 8 V) for other programming target memory cell connected to the same word line for programming into the memory state "00" no programming pulse having an amplitude of Vdp00 [0] (e.g., 5 V) is applied to the bit line connected to a memory cell which should be programmed to this memory state "01" (ST23). For the memory cell which should be programmed to the memory cell "01", step ST21 is a first programming step and step ST22 is a second programming step while step ST23 is substantially not a programming step.

Next, after the programming step of steps ST21 to ST23 is completed, the verification step (ST24, ST25) is executed. First, for verification, the word line voltage is changed over to Vgv (e.g., 5.5 V) and the bit line voltage is changed over to Vdv (e.g., 1 V) and the programmed state "01" to the memory cell is verified (ST24). Like the verification of the memory state "00" described previously, if the reading circuit 21 shown in FIG. 6 is used, one of the plural sense amplifiers 20 executes verification on the memory state "01". If the reading circuit 23 shown in FIG. 7 is used, the reference voltage for verification of the memory state "01" is changed over with the switch circuit 24 before the execution.

A verification result of the reading circuit 21 or 23 is outputted to the control circuit 18 and if a verification result passes (according to this embodiment, the threshold voltage of a programming target memory cell 100*a* is 4.7 V or more), the word line voltage and the bit line voltage are returned to the initial state under a control of the control circuit 18 and then, the programming sequence is terminated (ST25, period of t_Vgv-0 in FIG. 5).

Next, a case of programming so that the programming target memory cell turns to the memory state "10" is considered. As the initial (prior to programming) memory state, "11" is presumed. That is, programming from the initial memory state "00" or "01" to "10" is prohibited and programming from the initial memory state "10" to "10" is substantially not executed in order to prevent an excessive programming. For this embodiment, a case where the initial memory state is "11" will be described below.

Like the case of programming into the above-described memory state "00" or "01", first, the word line voltage is set to Vg10[0] (e.g., 6 V) and a programming pulse having a pulse width of Wp10[0] (e.g., 1 μsec) is applied to the bit line at an amplitude of Vdp10[0] (ST21). Next, although the word line voltage is set to Vg01[0] (e.g., 7 V) for other programming target memory cell to be connected to the same word line which programs into the memory state "01", no programming pulse having an amplitude of Vdp01[0] is applied to a bit line connected to a memory cell which should be programmed into this memory state "10" (ST22). Next, although the word line voltage is set to Vg00[0] (e.g., 8 V) for other programming target memory cell connected to the same word line which programs into the memory state "00", no programming pulse having an amplitude Vdp00[0] (e.g., 5 V) is applied to a bit line connected to a memory cell which should be programmed into this memory state "10" (ST23). For the memory cell which should be programmed into the memory state "10", step ST21 is a second programming step and steps ST22, ST23 are substantially not programming step.

Next, after the programming step of steps ST21 to ST23 is completed, the verification step (ST24, ST25) is executed. First, the word line voltage is changed over to Vgv (e.g., 5.5 V) and the bit line voltage is changed over to Vdv (e.g., 1 V) for the verification and the programmed state "10" to the memory cell is verified (ST24). If the reading circuit 21 shown in FIG. 6 is used like verification on the memory state "00" or "01" described previously, one of the plural sense amplifiers 20 executes the verification on the memory state "10". If the reading circuit shown in FIG. 7 is used, the reference voltage for the verification on the memory state "10" is changed over with the switch circuit 24 before the execution.

A verification result of the reading circuit 21 or 23 is outputted to the control circuit 18 and if the verification result passes (according to this embodiment, the threshold voltage of the programming target memory cell 100*a* is 3.7 V or more), the word line voltage and bit line voltage are returned to their initial state under a control of the control circuit 18 so as to terminate the programming sequence (ST25, period of t_Vgv·0 in FIG. 5).

Second Embodiment

The case where there exist plural programming target memory cells on the same word line and their object memory states (threshold voltages) are different has been stated a little in the description of the first embodiment. This case will be described in detail with reference to FIG. 3. In a following description, assume that a set of memory cells to be programmed to the memory state "10" is A0, a set of memory cells to be programmed to the memory state "01" is B0 and a set of memory cells to be programmed to the memory state "00" is C0. In the meantime, the method according to the second embodiment of the present invention is executed with the inventive device 10 shown in FIGS. 1, 2 like the first embodiment.

From the initial state (ST20), first, the word line voltage is charged up to Vg10[0] and a bit line voltage Vdp10[0] is applied to all the memory cells included in A0, B0, C0 with a pulse width Wp10[0] so as to raise the threshold voltages of all the programming target memory cells near 3.7 V (ST21). Next, word line voltage Vg01[0] is applied to the word line and a bit line voltage Vdp01[0] is applied to all the memory cells included in B0, C0 with a pulse width Wp01[0] so as to raise the threshold voltages of all the memory cells included in B0, C0 near 4.7 V (ST22). Further, the word line voltage is set to Vg00[0] and a bit line voltage Vdp00[0]

is applied to all the memory cells included in C0 with a pulse width Wp00[0] so as to raise the threshold voltages of all the memory cells included in C0 near 5.7 V (ST23). Here, steps ST21 to ST23 are programming step.

After the programming step of steps ST21 to ST23 of the first time is completed, the verification word line voltage is changed over to Vgv and the verification bit line voltage is set to Vdv so as to verify and after that, the word line voltage and bit line voltage are returned to the initial state. If the threshold voltages of all the memory cells included in A0, B0, C0 reach an object value (verification passes) (if YES in ST25), the programming is terminated. Although all the verification process of step ST24 is executed for all the programming target memory cells at the same time or dividedly several times, the verification for each memory cell is executed using the reading circuit 21 shown in FIG. 6 or the reading circuit 23 shown in FIG. 7 like the first embodiment. If the verification process is carried out for all the programming target memory cells, a reading circuit 21 or 23 is allocated to each memory cell. The verification process for each memory cell is the same as the first embodiment; therefore, its description will not be given here.

Next, a case for example where it is determined that one or plural memory cells A1 included in A0, one or plural memory cells B1 included in B0 and one or plural memory cells C1 included in C0 do not reach each object threshold voltage (if NO in ST25) will be described. From the initial state, a word line connected to the memory cells A1, B1, C1 is charged with a word line voltage Vg10[1] and a bit line voltage Vdp10[1] is applied to only the bit line connected to the memory cells A1, B1, C1 with a pulse width Wp10[1] so as to raise the threshold voltage of the memory cell A1 near 3.7 V (ST21) (the threshold voltages of the memory cells B1, C1 hardly change but remain to be 4.7 V and less than 5.7 V)

Next, a word line voltage Vg01[1] is applied to the word line and a bit line voltage Vdp01[1] is applied to only the bit line connected to the memory cells B1, C1 with a pulse width Wp01[1] so as to raise the threshold voltage of the memory cell B1 near 4.7 V (ST22) (the threshold voltage of the memory cell C1 hardly changes but remains to be less than 5.7 V). Further, a word line voltage Vg00[1] is applied to the word line and then a bit line voltage Vdp00[1] is applied to only the bit line connected to the memory cell C1 with a pulse width of Wp00[1] so as to raise the threshold voltage of the memory cell C1 near 5.7 V (ST23).

Next, after the programming step of steps ST21 to ST23 of the first time is completed, the verification word line voltage is changed over to Vgv and the verification bit line voltage is set to Vdv and then, the verification is performed like the first time. After that, the word line voltage and bit line voltage are returned to the initial state. If the threshold voltages of all the memory cells included in the memory cells A1, B1, C1 reach an object value (the verification passes, if YES in ST25), the programming is terminated. Because memory cells except the memory cells A1, B1, C1 in A0, B0, C0 have passed the verification of the first time, the verification result of the second time is omitted assuming that it naturally passes. If the verification does not pass (verification fails, if NO in ST25), the processing returns to step ST21 and steps ST21 to ST24 are repeated. In step ST25, until all the programming object cells become YES, application of a programming pulse to a programming target memory cell which does not reach an object threshold voltage, failing in verification, is repeated.

Third Embodiment

Figure 8:
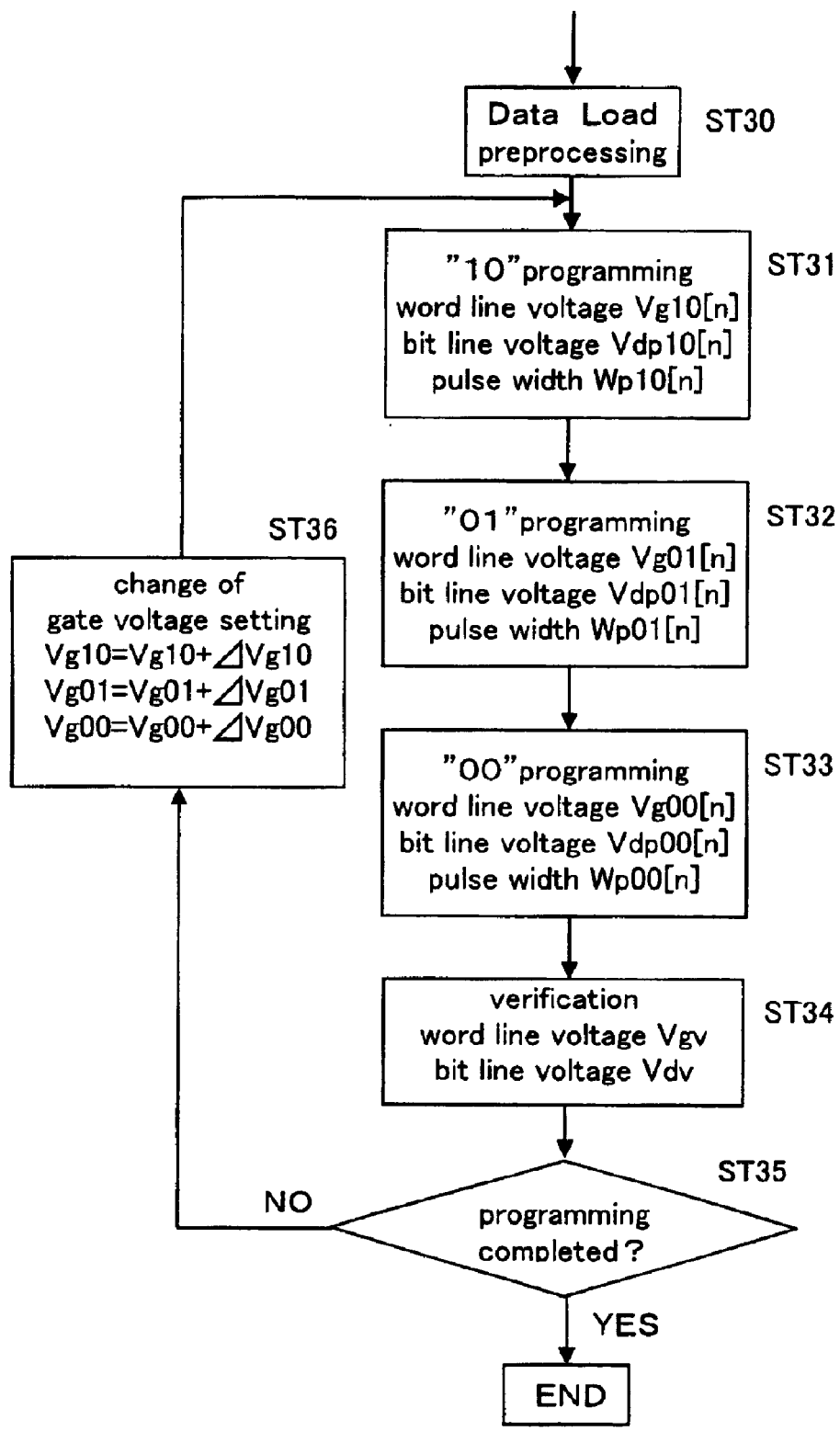
FIG. 8 is a flow chart showing a program sequence of the third embodiment of the programming method of the nonvolatile semiconductor memory device of the present invention.

Next, an embodiment for the case where there exist plural programming target memory cells on the same word line and their object memory states (threshold voltages) are different will be described with reference to a flow chart of FIG. 8. Here, like the second embodiment, it is assumed that a set of the memory cells to be programmed to the memory state "10" is A0, a set of the memory cells to be programmed to the memory state "01" is B0 and a set of the memory cells to be programmed to the memory state "00" is C0. Because in the programming sequence shown in FIG. 8, a flow of steps ST30 to ST35 is equal to the steps ST20 to ST25 (see FIG. 3) of the second embodiment; therefore, its description will not be given here.

For sets A1, B1, C1 of programming target memory cells whose verifications do not pass in step ST35 of the first time, the word line voltage Vg10[1] (=Vg10[0]+ΔVg10[1]) (ΔVg10[1] is a larger voltage than 0 V) is set up again (ST36), a word line voltage Vg10[1] is applied to the word line and then, Vdp[1] programming pulse is applied to the bit lines connected to the memory cells A1, B1, C1 with a pulse width of Wp10[1] (=Wp10[0]) (ST31). Next, the word line voltage Vg01[1] (=Vg01[0]+ΔVg01[1]) (ΔVg01[1] is a larger voltage than 0 V) is set up again (ST36), a word line voltage Vg01[1] is applied to the word line and then, Vdp01[1] voltage is applied to the bit line connected to the memory cells B1, C1 with a pulse width of Wp01[1] (=Wp01[0]) (ST32) and further, a word line voltage Vg00[1] (=Vg00[0]+ΔVg00[1]) (ΔVg00[1] is a larger voltage than 0 V) is set up again (ST36). A word line voltage Vg00[1] is applied to the word line and then, Vdp00[1] voltage is applied to the bit line connected to the memory cell C1 with a pulse width of Wp00[1] (=Wp00[0]) (ST33).

Next, a verification word line voltage Vgv is applied to the word line and a verification bit line voltage Vdv is applied to a bit line connected to the respective memory cells A1, B1, C1 so as to execute the same verification as the first time (ST34). Whether or not the threshold voltage of a memory cell whose verification fails in a last verification included in A0, B0, C0 reaches an object value is determined (ST35) and steps ST36, ST31 to ST35 are repeated to a memory cell required to be rewritten until the threshold voltages of all the memory cells reach an object value. In ST31 to ST33 which are repeated again, word line voltages Vg10[n], Vg01[n] and Vg00[n] are applied successively like the second time and voltages Vdp10[n], Vdp01[n], Vdp00[n] are applied to the bit line with a pulse width of Wp10[n], Wp01[n] and Wp00[n] successively. If verification fails, in step ST34, the verification process for a memory cell is executed. For the second time and following, in step ST36, the word line voltages Vg10[n], Vg01[n], Vg00[n] are increased by step successively so as to urge programming into a memory cell difficult to program.

Fourth Embodiment

Figure 9:
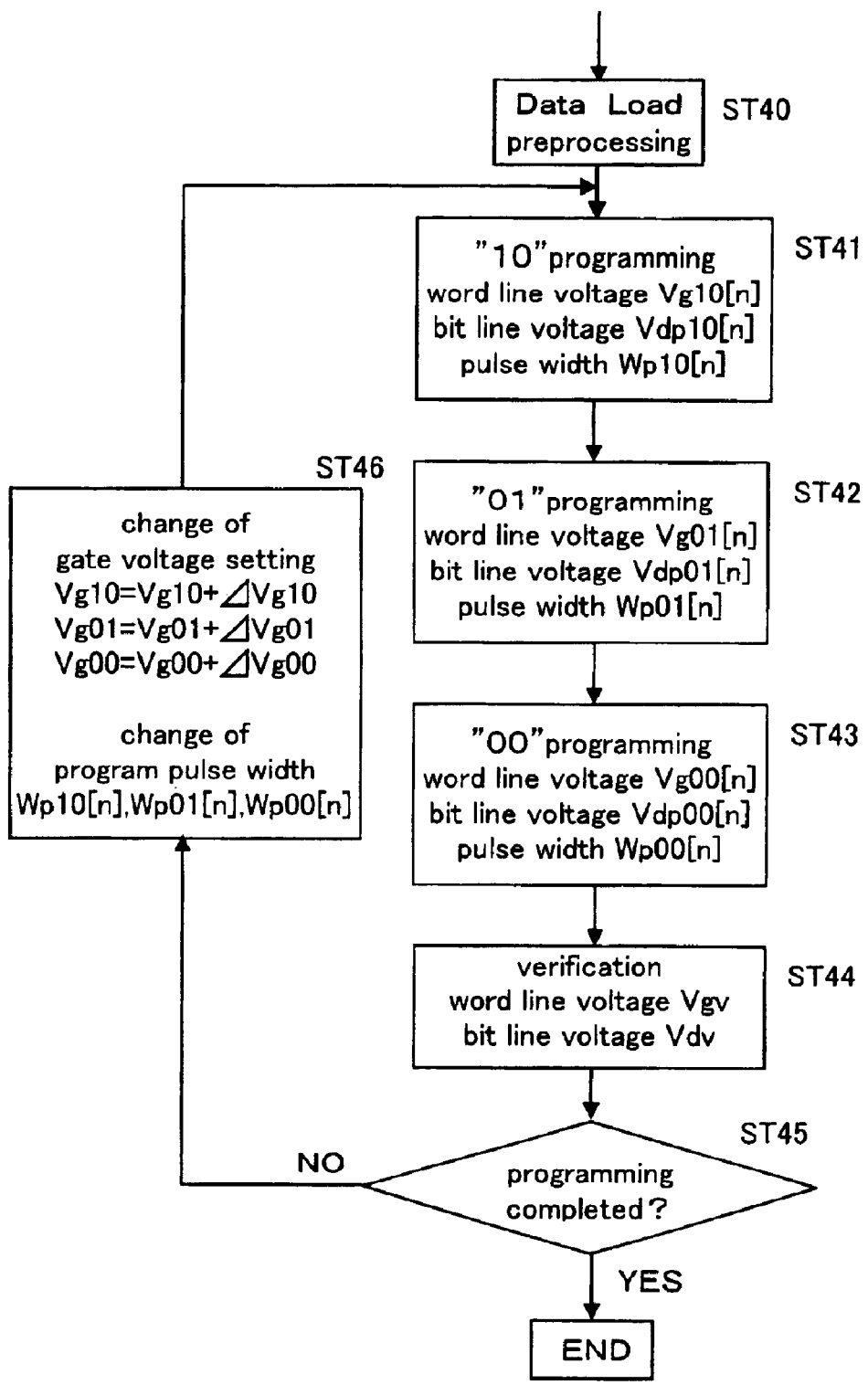
FIG. 9 is a flow chart showing a program sequence of the fourth embodiment of the programming method of the nonvolatile semiconductor memory device of the present invention.

A further embodiment in which there exist plural programming target memory cells on the same word line and the object memory states (threshold voltages) are different will be described with reference to a flow chart of FIG. 9. Because the flow of steps ST40 to ST45 in a programming sequence shown in FIG. 9 are the same as steps ST30 to ST35 (see FIG. 8) of the third embodiment; therefore, its description will not be given here.

Although in step ST36 (see FIG. 8) of the third embodiment, only the setting of the word line voltage is changed in step 36 until the verification passes, according to the fourth embodiment, the setting value of the programming pulse width is increased in step ST46 each time when the verification fails. That is, at the time of reprogramming of j time, by increasing the pulse width by step like Wp10[j]=Wp10[j−1]+ΔWp10[j], Wp01[j]=Wp01[j−1]+ΔWp01

[j], Wp00[j]=Wp00[j−1]+ΔWp00[j] (ΔWp10[j], ΔWp01[j], ΔWp00[j] are values larger than 0), the rewriting is carried out. After programming pulses are applied to a memory cell required to be rewritten by changing the word line voltages Vg10[n], Vg01[n], Vg00[n] and corresponding pulse widths Wp10[n], Wp01[n] and Wp00[n] successively, the verification is carried out and then, steps ST46, ST41 to ST45 are repeated to a memory cell required to be rewritten until the threshold voltages of all the memory cells reach an object value.

Fifth Embodiment

When rewriting into a memory cell determined not to reach a predetermined threshold voltage at the time of verification, according to the first and second embodiments, a bit line voltage (programming pulse) having the same pulse width as a word line voltage with the same amplitude as previously and according to the third embodiment, only the amplitude of the word line voltage is changed by step corresponding to the quantity of rewritings and according to the fourth embodiment, both the amplitude of the word line voltage and the pulse width of the bit line voltage are increased by step corresponding to the quantity of rewritings. Contrary to this, according to the fifth embodiment, while the word line voltage with the same width as previously is used, only the pulse width of the bit line voltage is increased by step corresponding to the quantity of rewriting so as to carry on the rewriting.

Although in description of the conventional arts, it has been described that the voltage applied to the control gate (word line in the memory array) of a memory cell is increased to increase the threshold voltage of the memory cell, the same effect can be obtained by increasing the pulse width. Because when rewriting using a bit line voltage (programming pulse) having the same pulse width as the word line voltage with the same amplitude as previously,- like-the first-and-second embodiments, changes in the threshold voltage of the memory cell decreases, the possibility that the quantity of rewriting may increase until a predetermined threshold voltage is reached rises and the controllability on the threshold voltage is improved. Therefore, this embodiment is effective for a case where the distribution of the threshold voltage corresponding to each storage condition needs to be narrowed such as a case of holding four-valued or higher valued memory state in a single memory cell. Conversely, if reduction of the programming time has preference over the controllability on the threshold voltage, if the rewriting is carried out under conditions in which the amplitude of the word line voltage and the pulse width are increased, the quantity of changes of the threshold voltage due to the rewriting increases, thereby enabling the quantity of the rewriting to be reduced until an object threshold voltage is reached.

That is, the methods described in the first to fifth embodiments can be selected considering a trade off between the controllability of the threshold voltage distribution and the programming time reduction effect in the scope of the first to fifth embodiments while the programming time is reduced more than the conventional art.

Sixth Embodiment

Figure 10:
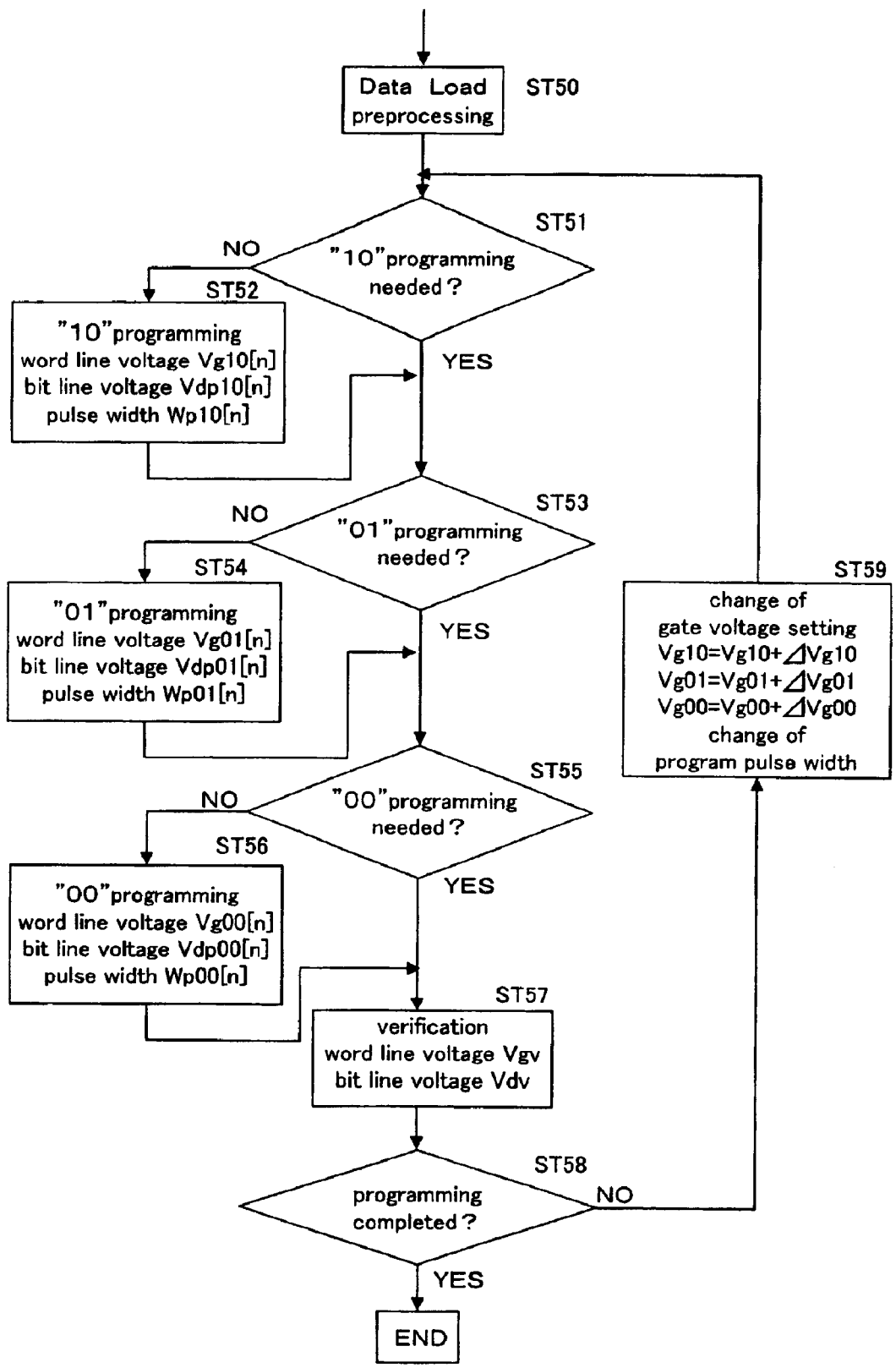
FIG. 10 is a flow chart showing a program sequence of the sixth embodiment of the programming method of the nonvolatile semiconductor memory device of the present invention.

Although according to the second to fifth embodiments, a case where there exist plural programming target memory cells on the same word line and the object memory states (threshold voltages) are different has been described, there can be a case where the object memory state (threshold voltage) is one or any programming condition is not included. For example, if a set of memory cells to be programmed into the memory state "10" is A0, a set of memory cells to be programmed into the memory state "01" is B0 and a set of memory cells to be programmed into the memory state "00" is C0, there is a possibility that of A0, B0, C0, the programming target memory cell is not included in A0, B0 or A0, B0. Further, a sequence whose programming time can be reduced will be explained with reference to a flow chart of FIG. 10. In FIG. 10, steps ST50, ST52, ST54, ST56, ST57, ST58, ST59 correspond to steps ST40, ST41, ST42, ST43, ST44, ST45, ST46 (see FIG. 9) of the fourth embodiment and the content of each processing is basically the same.

According to the sixth embodiment, after the pretreatment (ST50), first, whether or not a memory cell included in the memory cell A0 to be programmed into the memory state "10" exists is determined (ST51). If a memory cell included in the memory cell A0 to be programmed into the memory state "10" substantially does not exist in a programming target memory cell because programming into the memory state "10" ends before the programming into the memory states "01", "00" is terminated, the programming time is reduced by omitting step ST52 by omitting the programming into the memory state "10". Although this state is included in A0 as a case where a memory cell included in the memory cell A0 substantially does not exist, it corresponds to a case where the initial state before programming is "10". If the memory cell included in the memory cell A0 substantially does not exist in step ST51, the programming into the memory state "10" is not executed but the processing proceeds to step ST53. If substantially there exists a memory cell included in the memory cell A0, after the programming is executed in step ST52, the processing proceeds to step ST53. Further, after determining whether or not there exists a memory cell included in the memory cell B0 to be programmed to the memory state "01", if substantially there does not exist a memory cell included in the memory cell B0, the processing proceeds to next step ST55 without programming into the memory state "01". If there exists a memory cell included in the memory cell B0, the programming in step ST54 is carried out and the processing proceeds to step ST55. Further, after determining whether or not substantially there exists a memory cell included in the memory cell C0 to be programmed to the memory state "00", if there substantially does not exist a memory cell included in the memory cell C0, the programming into the memory state "00" is not executed but the processing proceeds to verification process of next step ST57. If there substantially exists a memory cell included in the memory cell C0, the processing proceeds to step ST57 after programming in the step ST56.

Because the verification step of steps ST57, ST58 and the resetting process for the word line voltage and pulse width of step ST59 are the same as the fourth embodiment; therefore, its description will not be given here.

By determining whether or not there exists a memory cell included in the memory cells A0, B0 or C0 to be programmed into the memory states "10", "01" or "00" in steps ST51, ST53, ST55, if any programming target memory cell is not included in at least a set of the memory cells A0, B0, C0, any one of corresponding programming steps ST52, ST54, ST56 can be omitted thereby reducing the total programming time.

According to the sixth embodiment, for example, plural programming target memory cells exist on the same word line and the initial state of all the programming target memory cells is "11". If a case for programming into only an object memory state "00" is presumed, the programming of steps ST52, ST54 is omitted in the programming step of the first time, that is, no word line voltages Vg10[0], Vg01[0] are applied but a word line voltage Vg00[0] (e.g., 8 V) is applied to a memory cell in the memory state "11" (the threshold voltage is less than 3 V), so that an excessive drain current flow through plural memory cells at the same time. Therefore, the sixth embodiment is employed as the seventh or eighth embodiment for actual purpose to avoid the above-described risk.

Seventh Embodiment

According to the seventh embodiment, by executing the programming in steps ST52, ST54 (see FIG. 10) forcibly in a sequential programming step of the first time or n time including the first time of the sixth embodiment without determination of steps ST51, ST53 (see FIG. 10), the above-described problem (problem that a high gate voltage is applied to a memory cell of a low threshold voltage so that an excessive drain current flows) can be solved. That is, by executing steps-ST51, ST53 at the time of rewriting of (n+1) time or following, the sixth embodiment is executed thereby a programming time needed for rewriting being reduced.

Eighth Embodiment

Figure 11:
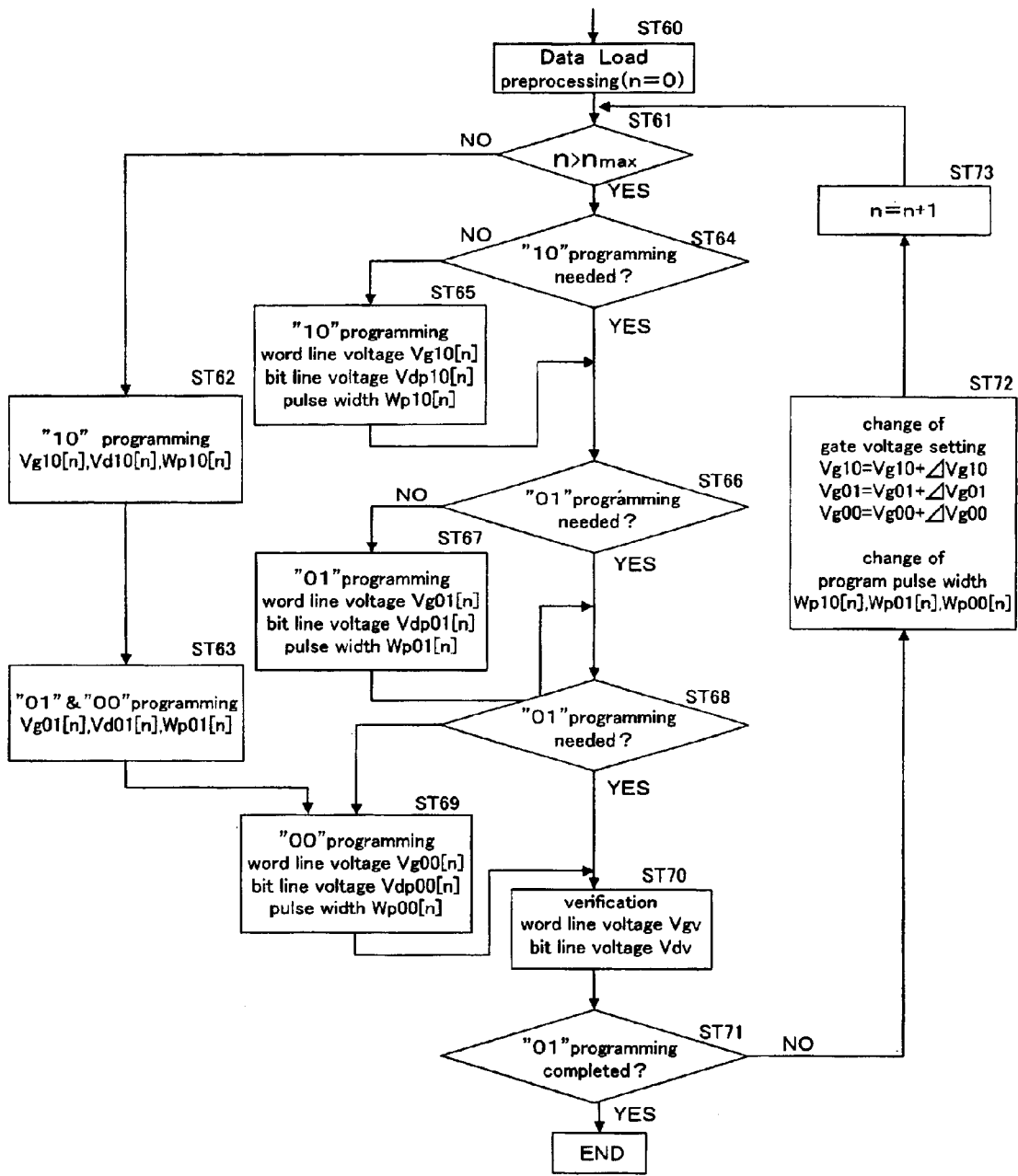
FIG. 11 is a flow chart showing a program sequence of the eighth embodiment of the programming method of the nonvolatile semiconductor memory device of the present invention.

According to the seventh embodiment, determination on whether or not steps ST51, ST53 is to be executed is necessary for every programming step. To avoid this complexity, it is permissible to execute the programming sequence shown in FIG. 11. That is, in a sequential programming step of the first time or n time including the first time, the programming of steps ST62, ST63 (corresponds to steps ST52, ST54 in FIG. 10) is executed.

The steps ST60, ST64 to ST72 of the eighth embodiment are basically the same as the steps ST50, ST51 to ST59 of the sixth embodiment. In the programming of ST65, ST67, ST69, the object programming condition is permitted to aim at only the memory cells "10", "01" and "00" as their programming objects.

The quantity n of the programming steps is set up to an initial value 0 in the pretreatment step ST60 and it is counted up by one in step ST73 each time when the verification fails in step ST71. Assuming that the quantity of times when no determination is done for steps ST51, ST53 is m, whether or not n>(m−1) is acceptable is determined in step ST61. For example, in case of m=2, whether or not n>1 is acceptable is determined in step ST61. Because n=0 and 1 for the first time and the second time respectively, any determination is NO so that programming process of steps ST62, ST63 corresponding to programming into the memory states "10", "01" is executed. Consequently, all the programming object cells rise by step to near 3.7 V and 4.7 V in threshold voltage. Because the first and second times progress to step ST62, ST63, ST69, ST70, ST71, the result is the same as the second to fifth embodiments. Because n=2 or more arises in the third time and following, the determination of step ST61 is YES, so that the procedure progresses from ST64 to ST71 like the sixth embodiment. Consequently, by increasing the threshold voltage and the applied word line voltage by step for a memory cell to be programmed into an object memory state "00" under the initial memory state "11", an excessive drain current is avoided and a programming time is reduced in the rewriting process of the (m+1) time and following.

Although step ST73 is provided after step ST72, this step may be provided at other place. Because a value "n" indicating the quantity of rewriting needs to be compared with a maximum value in order to prevent a rewriting processing from being repeatedly infinitely to a programming failure memory cell, count on the quantity of rewriting in step ST73 is preferred to be within the main routine or within a path of ST70-ST71-ST72-ST61. Further, usually, the quantity m is preferred to be set up within a range of 1 to 3. The quantity m is irrelevant to the quantity m of the bit lines BL in the memory array 11 shown in FIG. 2 like the n indicating the quantity of the rewriting.

Ninth Embodiment

Although in the first to eighth embodiments, a case where the memory state (threshold voltage state) which can be obtained by the memory cell is four-valued has been described, the inventive method exemplified in the first to eighth embodiments is not restricted to four-value as the multi-value level. The technical philosophy based on the inventive method exerts the same effect even if it is applied to programming of a N-value (N is a natural value of three or more) memory cell. If the memory state of the N-value is called level "1" to level "N" in order from a state in which the threshold voltage is lower, when a correspondence is made to the four-value, the level "2" or higher means programmed state. If the level of the programmed state is assumed to be M (M is a natural number of 2 or more to less than N), the programming process corresponding to each programmed state exists (N−1) times and if the word line voltage (in memory cell level, program gate voltage) of each programming process M (programming into the programmed state level M) is assumed to be VgM[n] (n indicates the quantity of rewritings and at the time of programming of the first time, 0), a relation of Vg(M−1)[n] <VgM[n] is established as a general equation (in case of the four-value, expressed as Vg10[n]<Vg01[n]<Vg00[n] as indicated in the first embodiment). The bit line voltage VdpM[n] (on memory cell level, program drain voltage) of the programming process M and the pulse width WpM[n] are assumed to be constant regardless of the number M like the first to eighth embodiments. The programming process M is executed successively to M=2 to N and after that, the verification process is carried out corresponding to an object memory state of the programming target memory cell so as to return the voltages of the word line and bit line to the initial state. In the verification process, the programming process M (M=2 to N) is repeated until all the programming target memory cells get into object memory state.

Figure 16:
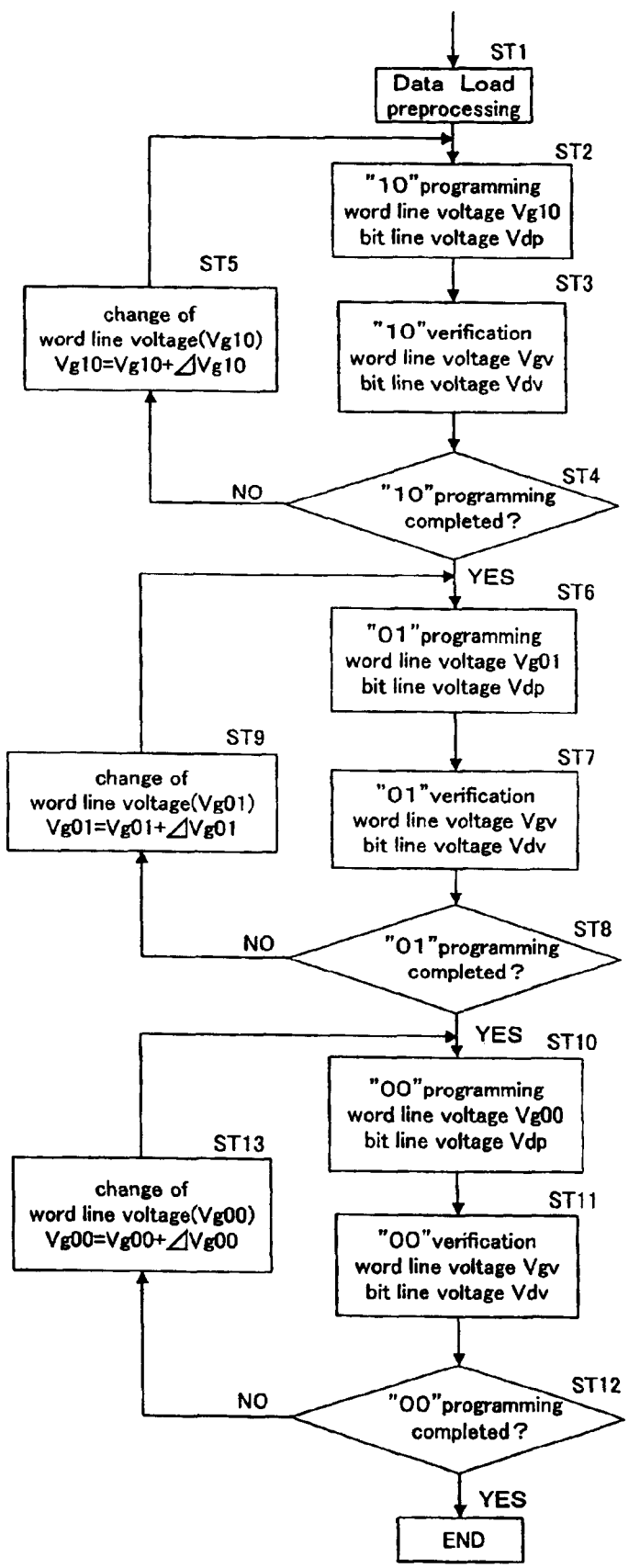
FIG. 16 is a flow chart showing an example of multi-value programming method of a conventional nonvolatile semiconductor memory device.
Figure 17:
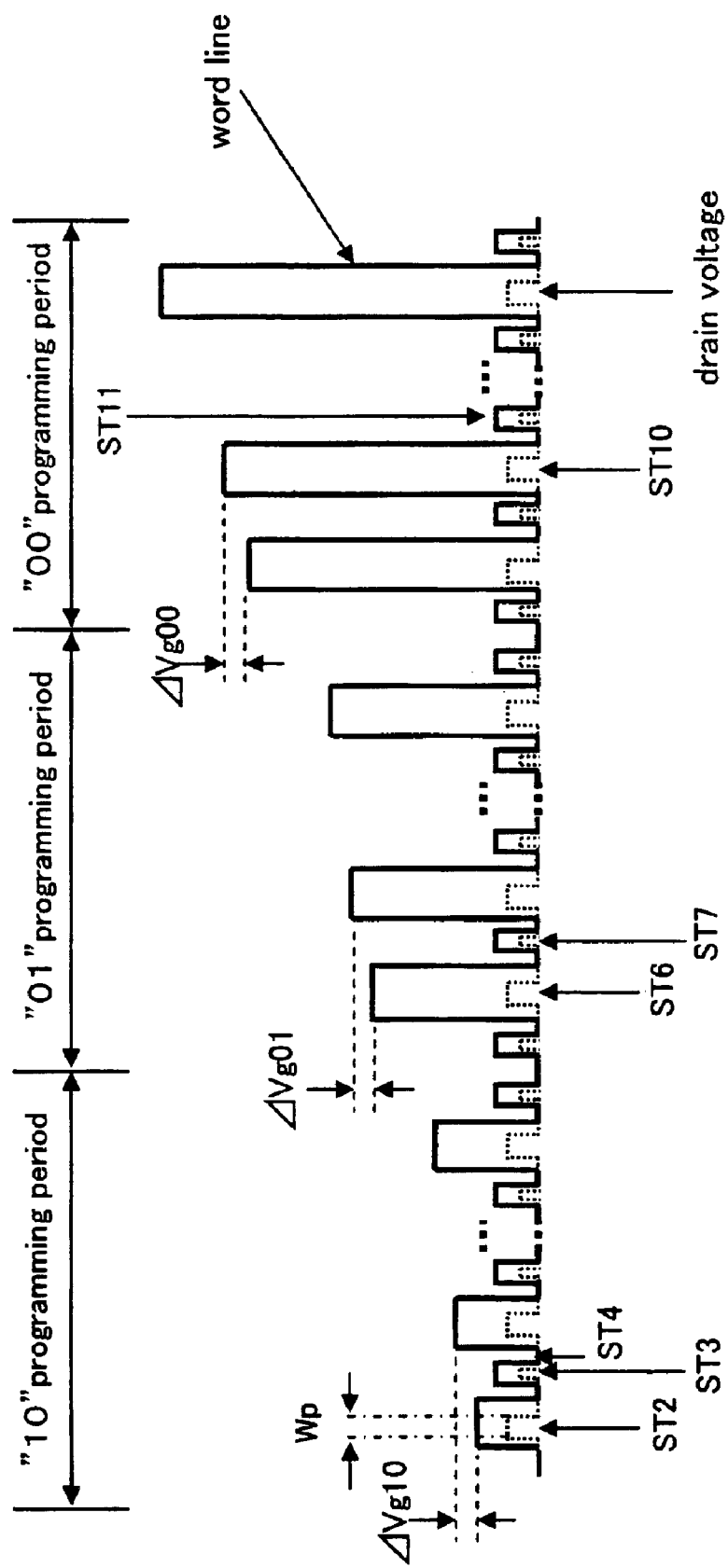
FIG. 17 is a diagram showing changes in voltage in the word line and bit line according to the multi-value programming method of the conventional nonvolatile semiconductor memory device.
Figure 18:
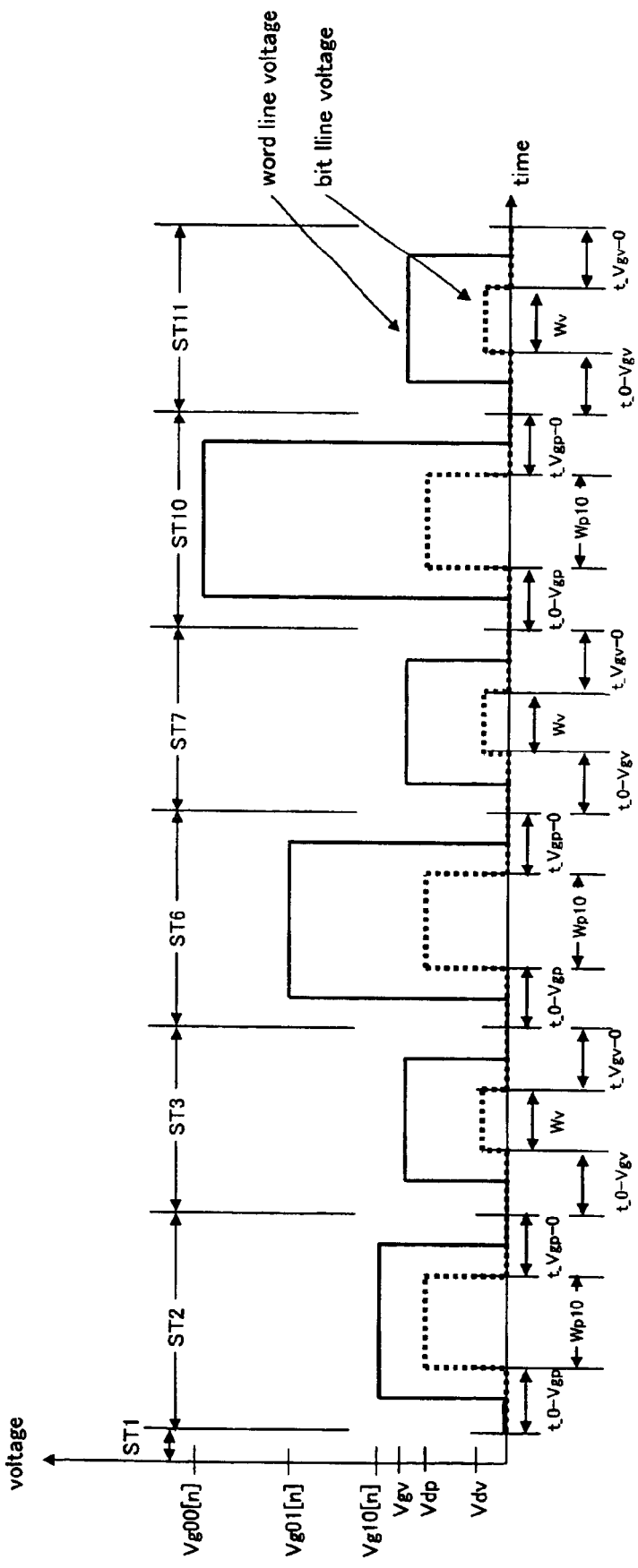
FIG. 18 is a diagram showing changes in voltage in the word line and bit line at the time of programming according to the multi-value programming method of the conventional nonvolatile semiconductor memory device.

Next, the reduction effect of the programming time according to the inventive method will be described using a specific example of the first embodiment. If as shown in FIG. 19, a time interval in which the word line is changed from 0 V to a word line voltage Vgp at the programming time while the bit line voltage is changed over from 0 V to a bit line voltage Vdp at the programming time is assumed to be t_0-Vgp (e.g., 2 μsec), and it is assumed that a period (pulse width) in which the bit line applies a programming pulse having a amplitude Vdp is Wp (e.g., 4 μsec), a time in which the word line is changed from a word line voltage Vgp in a certain programmed state (M−1) to a word line voltage Vgp in a next programmed state (M) is t_Vgp-Vgp (e.g., 1 μsec), a time in which the word line is changed from a word line voltage Vgp in a last programmed state to 0 V is t_Vgp-0 (e.g., 0.3 μsec), a time in which the word line is changed over from 0 V to a word line voltage Vgv for verification is t_0-Vgv (e.g., 8 μsec), a time (verification period) in which a bit line voltage Vdv for verification is applied to the bit line is Wv (e.g., 0.5 μsec) and a time necessary for changing from the word line voltage Vdv for verification to 0 V is t_Vgv-0 (e.g., 0.8 μsec), if programming of each memory cell in a conventional programming sequence shown in the flow chart of FIG. 16 is ended one time, the time taken for the programming is 25.8 μsec. FIG. 18 shows changes between the word line voltage and bit line voltage at this time. Contrary to this, if the programming of each memory cell is ended one time, the programming time based on the inventive method indicated in this flow chart is 18.6 μsec, which is about 30% faster than the conventional programming method. The changes between the word line voltage and bit line voltage at this time is as shown in FIG. 5. Further, because the change-over between the verification step and the programming step is infrequent, current consumption needed for charging/discharging of the word line and bit line can be reduced, thereby reduction in current consumption at the programming time being attained.

When programming into a programmed state of the multi-value level in the inventive device 10, by executing the verification after a word line voltage and bit line voltage corresponding to each programmed state are applied to reach a object programmed state by changing over the word line voltage, unnecessary time until the charging/discharging time of the word line and bit line and the word line voltage/bit line voltage are stabilized can be omitted, so that programming of the multi-value can be carried out rapidly.

Next, a still further embodiment of the inventive device 10 will be described.

Although according to the above-described embodiment, as the memory cell transistor structure which constitutes the memory cell, the floating gate type transistor structure shown in FIG. 12 is presumed, the memory cell transistor structure or the charge accumulation region structure is not restricted to this example. For example, the inventive method can be applied to even the charge accumulation region formed within ONO film (laminated structure of oxide film, nitride film and oxide film) as well as the floating gate 40 if it allows the multi-value programming.

Although in the above-described embodiment, the structure shown in FIG. 2 is exemplified as the structure of the memory array 11, the structure of the memory array is not restricted to the structure exemplified in FIG. 2. Although in the structure shown in FIG. 2, all the sources within the same block are made common and connected to a common source line, it is permissible to provide such a memory array structure of virtual ground line type in which the source lines on the same column are connected commonly so that the plural source lines are arranged in parallel to the bit lines.

Although the present invention has been described in terms of preferred embodiments, it will be appreciated that various modifications and alterations might be made by those skilled in the art without departing from the spirit and scope of the invention. The invention should therefore be measured in terms of the claims which follow.

What is claimed is:

1. A programming method of a nonvolatile semiconductor memory device,
    the nonvolatile semiconductor memory device comprising a memory cell array in which memory cells each having a transistor in which a charge accumulation region is formed between a channel region and a control gate region via insulation film and capable of obtaining three or more memory states including two or more programmed states corresponding to the level of a threshold voltage determined depending on the quantity of charge in the charge accumulation region are arranged in plural quantities each in a row direction and a column direction, while the control gates of the memory cell on the same row are connected to each other so as to form a common word line and the drains of the memory cells on the same column are connected to each other so as to form a common bit line, wherein
    plural program gate voltages corresponding to each of the two or more programmed states are set up preliminarily and if between a threshold voltage range corresponding to a memory state before programming and a threshold voltage range corresponding to a memory state after programming, there exists at least a threshold voltage range corresponding to other memory state in a programming target memory cell, a first programming step is executed by applying at least a first program gate voltage corresponding to at least one of the other memory states to the word line connected to the programming target memory cell and applying a predetermined program drain voltage to the bit line connected to the programming target memory cell, then a second programming step is executed by applying a second program gate voltage corresponding to a programmed state after the programming to the word line connected to the programming target memory cell and applying a predetermined program drain voltage to the bit line connected to the programming target memory cell, and thereafter a verification step of verifying whether or not a program is made in the programming target memory cell is executed.

2. The programming method of the nonvolatile semiconductor memory device according to claim 1, wherein
    if it is determined that no program is made in the programming target memory cell in the verification step, of the first programming step and the second programming step, at least the second programming step is executed again.

3. The nonvolatile semiconductor memory device according to claim 2, wherein
    the first program gate voltage or the second program gate voltage applied in at least one of the first programming step and the second programming step of a second time or following executed again is set higher than each voltage value applied at the first time in the first programming step or the second programming step.

4. The nonvolatile semiconductor memory device according to claim 2, wherein
    the first program gate voltage or the second program gate voltage applied in at least one of the first programming step and the second programming step of a second time or following executed again is set longer in terms of a programming period applied to the programming target memory cell at the same time when the program drain voltage is applied than the programming period of the first time.

5. A programming method of a nonvolatile semiconductor memory device,
    the nonvolatile semiconductor memory device comprising a memory cell array in which memory cells each having a transistor in which a charge accumulation region is formed between a channel region and a control gate region via insulation film and capable of obtaining three or more memory states including two or more programmed states corresponding to the level of a threshold voltage determined depending on the quantity of charge in the charge accumulation region are arranged in plural quantities each in a row direction and a column direction, while the control gates of the memory cell on the same row are connected to each other so as to form a common word line and the drains of the memory cells on the same column are connected to each other so as to form a common bit line, wherein
    plural program gate voltages corresponding to each of the two or more programmed states are set up preliminarily and if two or more programming target memory cells connected to the same word line are programmed simultaneously, a programming step is executed by applying two or more of the program gate voltages corresponding to two or more programmed states including programmed state after a programming successively in order from a lower voltage value to the word line connected to two or more of the programming target memory cells and by applying a predetermined program drain voltage to at least one of the bit lines connected to the programming target memory cell at the same time when each of the program gate voltages is applied, and thereafter a verification step for verifying whether or not a program is made into two or more of the programming target memory cells is executed.

6. The programming method of the nonvolatile semiconductor memory device according to claim 5, wherein two or more of the program gate voltages applied in the programming step include the program gate voltage having a lower voltage value than the program gate voltage corresponding to the programmed state after a programming.

7. The programming method of the nonvolatile semiconductor memory device according to claim 5, wherein for the bit line on which the predetermined program drain voltage is applied in the programming step, the threshold voltage range corresponding to the storage condition before the predetermined program drain voltage is applied of the programming target memory cell connected to the bit line is lower than the threshold voltage range corresponding to a programmed state which determines the program gate voltage applied when the predetermined program drain voltage is applied.

8. The programming method of the nonvolatile semiconductor memory device according to claim 5, wherein if it is determined that no program is made into at least one of the programming target memory cells in the verification step, the programming step is executed again.

9. The programming method of the nonvolatile semiconductor memory device according to claim 8, wherein the memory cell determined to be subjected to programming in the verification step is excluded from the programming target memory cell in the programming step of the second time or following to be executed again.

10. The programming method of the nonvolatile semiconductor memory device according to claim 8, wherein in the programming step of the first time and the second time or following to be executed again, two or more of the program gate voltages applied in the programming step of at least the first time include the program gate voltage having a lower voltage value than the program gate voltage corresponding to a programmed state after a programming.

11. A nonvolatile semiconductor memory device comprising:

a memory cell array in which memory cells each having a transistor in which a charge accumulation region is formed between a channel region and a control gate region via insulation film and capable of obtaining three or more memory states including two or more programmed states corresponding to the level of a threshold voltage determined depending on the quantity of charge in the charge accumulation region are arranged in plural quantities each in a row direction and a column direction, while the control gates of the memory cell on the same row are connected to each other so as to form a common word line and the drains of the memory cells on the same column are connected to each other so as to form a common bit line;

programming means for applying selectively plural program gate voltages set preliminarily corresponding to each of the two or more programmed states to the word line connected to the programming target memory cell while applying a predetermined program drain voltage to the bit line connected to the programming target memory cell; and verifying means for verifying whether or not the programming target memory cell is programmed, wherein if between a threshold voltage range corresponding to a memory state before programming and a threshold voltage range corresponding to a memory state after programming, there exists at least a threshold voltage range corresponding to other memory state in a programming target memory cell, a first programming step is executed by applying at least a first program gate voltage corresponding to at least one of the other memory states to the word line connected to the programming target memory cell, and applying a predetermined program drain voltage to the bit line connected to the programming target memory cell, then a second programming step is executed by applying a second program gate voltage corresponding to the programming data, and applying a predetermined program drain voltage to the bit line connected to the programming target memory cell, and thereafter a verification step of verifying whether or not a program is made in the programming target memory cell is executed.

12. The nonvolatile semiconductor memory device according to claim 11, wherein the verifying means includes plural sense amplifiers corresponding to the quantity of the programmed states which the memory cell can obtain for every verifying object memory cell which executes the verification step at the same time and a reference voltage of a different inherent voltage value is applied to each of the plural sense amplifiers.

13. The nonvolatile semiconductor memory device according to claim 11, wherein the verifying means includes a sense amplifier for every verifying object memory cell which executes the verification step at the same time and depending on the quantity of the programmed states which the memory cell can obtain, the plural reference voltages each having a different voltage value is used selectively for the sense amplifier through a switch circuit.

14. A nonvolatile semiconductor memory device comprising:

a memory cell array in which memory cells each having a transistor in which a charge accumulation region is formed between a channel region and a control gate region via insulation film and capable of obtaining three or more memory states including two or more programmed states corresponding to the level of a threshold voltage determined depending on the quantity of charge in the charge accumulation region are arranged in plural quantities each in a row direction and a column direction, while the control gates of the memory cell on the same row are connected to each other so as to form a common word line and the drains of the memory cells on the same column are connected to each other so as to form a common bit line;

programming means for applying selectively plural program gate voltages set preliminarily corresponding to each of the two or more programmed states to the word line connected to the programming target memory cell while applying a predetermined program drain voltage to the bit line connected to the programming target memory cell; and verifying means for verifying whether or not the programming target memory cell is programmed, wherein if two or more programming target memory cells connected to the same word line are programmed simultaneously, the programming means executes a programming step in which by applying two or more of the program gate voltages corresponding to two or more programmed states including a programmed state after a programming to the word line connected to two or more of the programming target memory cells in order from a lower voltage value, a predetermined program drain voltage is applied to at least one of the bit lines connected to the programming target memory cells at the same time when each of the program gate voltages is applied, and the verifying means executed a verification step for verifying whether or not two or more of the programming target memory cells are programmed.

15. The nonvolatile semiconductor memory device according to claim 14, wherein the verifying means includes plural sense amplifiers corresponding to the quantity of the programmed states which the memory cell can obtain for every verifying object memory cell executing the verification step at the same time and a reference voltage of a different inherent voltage value is applied to each of the plural sense amplifiers.

16. The nonvolatile semiconductor memory device according to claim 14, wherein the verifying means includes a sense amplifier for every verifying object memory cell executing the verification step at the same time and depending on the quantity of the programmed states which the memory cell can obtain, the plural reference voltages each having a different voltage value is used selectively for the sense amplifier through a switch circuit.

* * * * *